(12) United States Patent
Garzon Bohorquez et al.

(10) Patent No.: US 10,560,124 B2
(45) Date of Patent: Feb. 11, 2020

(54) INTERLEAVER FOR TURBO CODES AS A FUNCTION OF THE PUNCTURING PATTERN

(71) Applicants: ORANGE, Paris (FR); INSTITUT MINES TÉLÉCOM, Brest (FR)

(72) Inventors: Ronald Edicson Garzon Bohorquez, Brest (FR); Charbel Abdelnour, Brest (FR); Catherine Douillard, Brest (FR)

(73) Assignees: ORANGE, Paris (FR); INSTITUT MINES TÉLÉCOM, Brest (FR)

( * ) Notice: Subject to any disclaimer, the term of this patent is extended or adjusted under 35 U.S.C. 154(b) by 0 days.

(21) Appl. No.: 15/738,004

(22) PCT Filed: Jun. 20, 2016

(86) PCT No.: PCT/EP2016/064164
§ 371 (c)(1),
(2) Date: Dec. 19, 2017

(87) PCT Pub. No.: WO2016/203039
PCT Pub. Date: Dec. 22, 2016

(65) Prior Publication Data
US 2019/0349011 A1    Nov. 14, 2019

(30) Foreign Application Priority Data

Jun. 19, 2015   (FR) ..................... 15 55670

(51) Int. Cl.
| H03M 13/00 | (2006.01) |
| H03M 13/27 | (2006.01) |
| H03M 13/29 | (2006.01) |

(52) U.S. Cl.
CPC ..... *H03M 13/2771* (2013.01); *H03M 13/271* (2013.01); *H03M 13/2753* (2013.01);
(Continued)

(58) Field of Classification Search
CPC ......... H03M 13/2771; H03M 13/6362; H03M 13/2792; H03M 13/296; H03M 13/271; H03M 13/2753
See application file for complete search history.

(56) References Cited

U.S. PATENT DOCUMENTS

| 2002/0007475 A1 | 1/2002 | Crozier |
| 2004/0139378 A1* | 7/2004 | Akhter .............. H03M 13/2707 714/755 |

(Continued)

FOREIGN PATENT DOCUMENTS

| EP | 2448127 A1 | 5/2012 |
| WO | 2000010257 A1 | 2/2000 |

(Continued)

OTHER PUBLICATIONS

International Search Report and Written Opinion dated Aug. 31, 2016 for International Application No. PCT/EP2016/064164, filed Jun. 20, 2016.

(Continued)

*Primary Examiner* — Samir W Rizk
(74) *Attorney, Agent, or Firm* — David D. Brush; Westman, Champlin & Koehler, P.A.

(57) ABSTRACT

A method is provided for encoding an input digital message bearing K information symbols using a turbo-encoder forming a turbocode, the turbo-encoder including an interleaver and first and second encoders for encoding according to at least one elementary code and delivering the information symbols and redundancy symbols. With a puncturing of the symbols delivered by the turbo-encoder being done according to at least one periodic puncturing pattern of a length N, defining the puncturing period N, the interleaver distributes the information symbols of the input message into Q layers of the interleaved input message in complying with an interleaving function defined from the at least one punctur- (Continued)

ing pattern, according to the relationship: $\pi(i)=Pi+S(i \bmod Q) \bmod K = Pi + (T_j + A_j Q) \bmod K$.

14 Claims, 21 Drawing Sheets

(52) U.S. Cl.
CPC ..... *H03M 13/2792* (2013.01); *H03M 13/296* (2013.01); *H03M 13/6362* (2013.01)

(56) References Cited

U.S. PATENT DOCUMENTS

| | | | | |
|---|---|---|---|---|
| 2007/0288834 | A1* | 12/2007 | Crozier | H03M 13/2771 714/790 |
| 2008/0086674 | A1 | 4/2008 | Shen | |
| 2008/0256424 | A1 | 10/2008 | Shen | |
| 2010/0077265 | A1* | 3/2010 | Wei | H03M 13/2775 714/701 |
| 2016/0352361 | A1* | 12/2016 | Fonseka | H03M 13/2906 |

FOREIGN PATENT DOCUMENTS

| | | |
|---|---|---|
| WO | 2000035103 A1 | 6/2000 |
| WO | 2006069392 A1 | 6/2006 |
| WO | 2007047472 A1 | 4/2007 |
| WO | 2008057041 A2 | 5/2008 |
| WO | 2010148763 A1 | 12/2010 |

OTHER PUBLICATIONS

English translation of the International Search Report and Written Opinion dated Aug. 31, 2016 for International Application No. PCT/EP2016/064164, filed Jun. 20, 2016.
Hyun-Kyung Kim et al: "Interleaver design for punctured turbo codes based on RSC code structure", Proc. International Conference on ICT Convergence (ICTC), IEEE, Oct. 14, 2013 (Oct. 14, 2013). pp. 393-397, XP032527058.
Chatzigeorgiou I et al: "Punctured binary turbo-codes with optimized performance", Proc. 62nd IEEE Vehicular Technology Conference 2005 (VTC—2005—Fall), Dallas, TX, USA Sep. 25-28, 2005, Piscataway, NJ, USA, IEEE, vol. 3, Sep. 25, 2005 (Sep. 25, 2005), pp. 1965-1969, XP010878817.
Berrou C et al: "Designing good permutations for turbo codes: towards a single model", Proc. 2004 IEEE International Conference on Communications (ICC 2004), Jun. 20-24, 2004, Paris, IEEE Operations Center, Piscataway, NJ, USA, vol. 1, Jun. 20, 2004 (Jun. 20, 2004), pp. 341-345, XP010710014.
Motorola: "Contention-Free Interleaver Designs for LTE Turbo Codes", Internet Citation, Jan. 19, 2007 (Jan. 19, 2007), XP002473951.
A. Perotti et al: "A New Upper Bound on the Minimum Distance of Turbo Codes", IEEE Transactions on Information Theory, vol. 50, No. 12, Dec. 1, 2004 (Dec. 1, 2004), pp. 2985-2997, XP055260197.
Jinhong Yuan et al: "Combined Turbo Codes and Interleaver Design", IEEE Transactions on Communications, IEEE Service Center, Piscataway, NJ. USA, vol. 47, No. 4, Apr. 1, 1999 (Apr. 1, 1999), XP011009398.
Ronald Garzon Bohorquez et al: "On the Equivalence of Interleavers for Turbo Codes", IEEE Wireless Communications Letters, vol. 4, No. 1, Feb. 1, 2015 (Feb. 1, 2015), pp. 58-61, XP55258757.

C. Berrou (ed.), "Codes et turbocodes" (Codes and turbocodes), "Chapitre 7: Turbocodes convolutifs" (Chapter 7: Convolutive turbocodes), IRIS Collection, Springer, 2007.
W. Ryan et al, "Punctured Turbo-Codes for BPSK/QPSK Channels" IEEE Trans. Commun., vol. 47, No. 9, pp. 1315-1323, Sep. 1999.
F. Mo et al., "Analysis of Puncturing Pattern for High Rate Turbo Codes", Proc. IEEE Conference on Military Communications (MIL-COM 1999), vol. 1, Sep. 1999, pp. 547-550.
S. Crozier et al., "On Designing Turbo-Codes with Data Puncturing", Canadian Workshop of Information Theory (CIT 2005), Jun. 2005.
S. Crozier et al., "Rate-Compatible Turbo Codes Designed with Puncture-Constrained DRP Interleavers", IEEE Global Telecommun. Conf., Dec. 2011, pp. 1-5.
S. Crozier et al., "On the Error-Rate Performance of 4-State Turbo Codes with Puncture-Constrained DRP Interleavers", IEEE International Conference on Communications (ICC), Jun. 2012, pp. 2601-2605.
S. Crozier and P. Guinand, "High-Performance Low-Memory Interleaver Banks for Turbo-Codes", IEEE 54, Vehicular Technology Conference, vol. 4, Oct. 2001, pp. 2394-2398.
J. Sun and O. Takeshita, "Interleavers for Turbo Codes Using Permutation Polynomials Over Integer Rings," IEEE Trans. Inf. Theory, vol. 51, No. 1, pp. 101-119, Jan. 2005.
C. Berrou et al., "Computing the Minimum Distance of Linear Codes by the Error Impulse Method," IEEE Global Telecommun. Conf., vol. 2, Nov. 2002, pp. 1017-1020.
R. Garello and A. Vila-Casado, "The All-Zero Iterative Decoding Algorithm for Turbo Code Minimum Distance Computation," IEEE Internationl Conference on Communications (ICC), vol. 1, Jun. 2004, pp. 361-364.
S. Crozier et al., "Estimating the Minimum Distance of Turbo-Codes Using Double and Triple Impulse Methods," IEEE Commun. Lett., vol. 9, No. 7, pp. 631-633, 2005.
S. Crozier et al., "Estimating the Minimum Distance of Large-Block Turbo Codes using Iterative Multiple-Impulse Methods," 4th Int. Symposium on Turbo Codes and Related Topics (ISTC), 2006, pp. 1-6.
S. Crozier et al., "Estimating the Minimum Distance of Large-Block Turbo Codes using the Event Impulse Method," Int. Symposium on Turbo Codes and Iterative Information Processing (ISTC), Sep. 2010, pp. 439-443.
M. Cedervall and R. Johannesson, "A Fast Algorithm for Computing Distance Spectrum of Convolutional Codes," IEEE Trans. Inf. Theory, vol. 35, No. 6, pp. 1146-1159, Nov. 1989.
S. Benedetto and G. Montorsi, "Unveiling Turbo Codes: Some Results on Parallel Concatenated Coding Schemes," IEEE Trans. inf. Theory, vol. 42, No. 2, pp. 409-428, 1996.
N. Biggs, "Minimal regular graphs with given girth," Algebraic graph theory, Cambridge University Press, 1974, pp. 180-190.
E. Boutillon and D. Gnaedig, "Maximum spread of D-dimensional multiple turbo codes," IEEE Trans. Commun., vol. 53, No. 8, pp. 1237-1242, Aug. 8, 2005.
Y. Saouter, "Selection procedure of turbocodes parameters by combinatorial optimization," Int. Symposium on Turbo Codes and Iterative Information Processing (ISTC), Sep. 2010, pp. 156-160.
H. Ma and J. K. Wolf, "On tail-biting convolutional codes", IEEE Trans. Commun., vol. 34, No. 2, pp. 104-111, Feb. 1986.
C. Weiss et al., "Turbo Decoding with Tail-Biting Trellises", URSI Intern. Symp. on Signals, Systems, and Electronics (ISSSE), Oct. 1998, pp. 343-348.
C. Weiss et al., "Code Construction and Decoding of Parallel Concatenated Tail-Biting Codes," IEEE Trans. Inform. Theory, vol. 47, No. 1, pp. 336-386, Jan. 2001.

\* cited by examiner

Puncturing patterns of information symbols

| | 0 | 1 | 2 | 3 | 4 | 5 | 6 | 7 |
|---|---|---|---|---|---|---|---|---|
| | 1 | 0 | 1 | 0 | 0 | 0 | 0 | 0 |

Redundancies 1

| 1 | 1 | 1 | 0 | 1 | 1 | 1 | 1 |
|---|---|---|---|---|---|---|---|

Redundancies 2

| 0 | 1 | 0 | 1 | 1 | 0 | 1 | 0 |
|---|---|---|---|---|---|---|---|

Fig. 10A

Puncturing patterns of information symbols

| | 0 | 1 | 2 | 3 | 4 | 5 | 6 | 7 |
|---|---|---|---|---|---|---|---|---|
| | 1 | 0 | 1 | 0 | 0 | 0 | 0 | 0 |

Redundancies 1

| 1 | 1 | 1 | 0 | 1 | 1 | 1 | 1 |
|---|---|---|---|---|---|---|---|

Redundancies 2

| 0 | 1 | 0 | 1 | 1 | 0 | 1 | 0 |
|---|---|---|---|---|---|---|---|

Ranking of positions in dashes:   2       1       3

Ranking of positions in solid lines:       2       1       3

Final ranking:   2     5   1   4   3   6

Fig. 10B

Connection mask of non-punctured information symbols

Puncturing patterns for information symbols

Redundancies 1

Redundancies 2

INTERLEAVER FOR TURBO CODES AS A FUNCTION OF THE PUNCTURING PATTERN

CROSS-REFERENCE TO RELATED APPLICATIONS

This Application is a Section 371 National Stage Application of International Application No. PCT/EP2016/064164, filed Jun. 20, 2016, the content of which is incorporated herein by reference in its entirety, and published as WO 2016/203039 on Dec. 22, 2016, not in English.

TECHNICAL FIELD

The present invention relates to methods and computer program products for the encoding of an input digital message using a turbo-encoder, especially of the puncturing type.

In particular, the invention relates to interleaving implemented by the turbo-encoder.

BACKGROUND

Turbocodes are error corrector codes, the performance of which approaches Shannon's limit as described in C. Berrou (ed.), *"Codes et turbocodes"* (*Codes and turbocodes*), "Chapitre 7: Turbocodes convolutifs" (Chapter 7: Convolutive turbocodes), IRIS Collection, Springer, 2007. The conventional structure of a turbo-encoder 1, shown in FIG. 1A, comprises the parallel concatenation of two recursive systematic convolutive codes C1 and C2 (CSR) separated by an interleaver 2. The input digital message of a length K is encoded in its order of arrival, called its natural order, by the encoder C1, and in the interleaved or permutated order by the encoder C2.

At reception, as shown in FIG. 2, the decoding of the code makes use of two soft input and output decoders or SISO (Soft-In Soft-Out) decoders. On the basis of information on the information symbols $L_c y_s$, and on the redundancy symbols $L_c y_{r1}$ and $L_c y_{r2}$, available at the output of the channel, each decoder computes a piece of information known as extrinsic information $L_{e1}$ and $L_{e2}$ on the decoded information symbols which it exchanges with the other decoder following an iterative process. The decoders thus converge towards a common decision $L_1$.

The rate of this overall encoding R of the turbocode of FIG. 1A is equal to 1/3 (before puncturing). The technique most widely used to increase the encoding rate of a turbocode consists in puncturing the transmitted symbols with a periodic pattern. With this technique, the same encoder and the same decoder can be used for all the encoding rates. Moreover, it is accepted that it is preferable to puncture the redundancy symbols Y1 and Y2 rather than the information symbols as explained in O. Acikel and W. Ryan, *"Punctured turbo-codes for BPSK/QPSK channels"* IEEE Trans. Commun., vol. 47, No. 9, pp. 1315-1323, September 1999, and F. Mo et al., *"Analysis of puncturing pattern for high rate turbo codes"*, Proc. IEEE Conference on Military Communications (MIL-COM 1999), vol. 1, September 1999, pp. 547-550. Indeed, at reception, the information symbols are used to decode two elementary codes C1 and C2 while each redundancy is only used for the decoding of one of the codes. The absence of an information symbol is therefore in principle more penalizing than the absence of a redundancy symbol.

The puncturing of the information symbols is described in the US patent application 2008/0256424.

As shown in the article by S. Crozier et al., *"On designing turbo-codes with data puncturing"*, Canadian Workshop of Information Theory (CWIT 2005), June 2005, *"Rate-compatible turbo codes designed with puncture-constrained DRP interleavers"*, IEEE Global Telecommun. Conf., December 2011, pp. 1-5, and *"On the error-rate performance of 4-state turbo codes with puncture-constrained DRP interleavers"*, IEEE International Conference on Communications (ICC), June 2012, pp. 2601-2605, puncturing carefully chosen information symbols can increase the minimum Hamming distance of the turbocode and therefore improve its performance at low error rates, without in any way impairing its performance at high and medium error rates. However, to the knowledge of the Applicant, there is no method in existence relating to the manner of choosing the puncturing pattern, especially the number and positions of the punctured information symbols.

When information symbols are punctured, not all the puncturing patterns are permissible. The puncturing patterns leading to minimum Hamming distances of the elementary code equal to 0 or to 1, called catastrophic patterns, must be eliminated. Indeed, under such conditions, the elementary code loses its corrective power and, even at very low noise levels, the decoder takes wrong decisions and leads to a high error rate.

In addition, the level of reliability of the extrinsic information computed on an information symbol output from an elementary decoder depends inter alia on the position of the symbol considered in the puncturing period, the puncturing or non-puncturing of the associated redundancies and the number of punctured redundancies associated with the information symbol as the case may be. Indeed, when a single redundancy is computed by the elementary code for each information symbol, i.e. in the case of a rate $R_C$ of the non-punctured elementary code equal to 1/2 in the case of a binary code, when the redundancy is punctured, the extrinsic information computed on the corresponding information symbol is less reliable than when the redundancy is not punctured. Similarly, when several redundancies are computed by the elementary code for each information symbol, i.e. for a rate $R_C$ of the non-punctured elementary code that is lower than 1/2 in the case of a binary code, the greater the number of punctured redundancies, the lower is the reliability of the extrinsic information computed on the corresponding information symbol.

The aspect of the known error rate curve at output of a turbo-decoder is shown in FIG. 3. In the top part of the curve, with high and medium error rates, called a waterfall region, there is a region of high decrease of error rate as a function of the signal-to-noise ratio. Then, beyond a certain value of the signal-to-noise ratio, the slope of the curve diminishes indicating that the asymptotic gain of the turbocode has been attained, in a region called an error floor or error flare. The asymptotic gain of the turbocode is fixed by its distance spectrum which lists the number of words of the code at the minimum Hamming's distance and at the greater distances. The number of words of the code at the distance d is called a multiplicity associated with d.

The performance of a turbocode, especially at low error rates, in what is called the flare region, is highly dependent on the interleaving function.

The interleaver of a turbo-encoder enables efficient curbing of the occurrence of error packets at reception, at the input of at least one of the two decoders corresponding to the codes C1 and C2, playing in this way a role in the performance levels of the turbocode in the waterfall region. The interleaver also has an impact on the minimum Hamming distance of the turbocode which governs its behavior at low error rates in the flare region.

The first goal of error packet dispersal is easily obtained by means of a regular interleaver as described in C. Berrou mentioned here above, for example a row-column interleaver. However, this book shows that this type of interleaver cannot be used to obtain high minimum Hamming distances because it produces rectangular error patterns of low weight. An efficient interleaver makes it possible to break the regularity of the rectangular error patterns by introducing a degree of disorder or irregularity.

Turbocode-interleaving methods are known from the patent applications WO 2000/035103, WO 2000/010257, WO 2006/069392, US 2007/0288834, WO 2007/047472, WO 2008/057041, and WO 2010/148763.

Several families of irregular interleavers are known, especially what are called ARP (Almost Regular Permutation) interleavers, described in C. Berrou et al., "*Designing good permutations for turbocodes: towards a single model*," IEEE International Conference on Communications, vol. 1, 2004, pp. 341-345, or DRP (Dithered Relative Prime), described in the article by S. Crozier and P. Guinand, "*High-performance low-memory interleaver banks for turbo-codes*," IEEE 54th Vehicular Technology Conference, vol. 4, October 2001, pp. 2394-2398, or QPP (Quadratic Permutation Polynomial), described in the article by J. Sun and O. Takeshita, "*Interleavers for turbo codes using permutation polynomials over integer rings*," IEEE Trans. Inf. Theory, vol. 51, No. 1, pp. 101-119, January 2005.

The ARP and DRP interleavers are based on an overall regular circular interleaving into which a certain degree of disorder is inserted through a local permutation.

The ARP interleaver described especially in the application US 2008/0086674, is based on the following mathematical model:

$$\Pi(i)=(Pi+S(i \bmod Q)) \bmod K,$$

where $i=0 \ldots K-1$ represents the address of the information symbol after interleaving and $\Pi(i)$ represents the address of the same symbol before interleaving as represented in FIG. 4 in the case of circular elementary code. The parameters of this interleaver are P the period of the regular interleaver Q, a divider of K, representing the degree of disorder inserted by means of the vector S, corresponding to the adjustment vector inserting the irregularities in the regular interleaver by means of Q integer values.

The regular interleaver is expressed by: $\Pi(i)=Pi \bmod K$, with $i=0 \ldots K-1$.

The DRP interleaver, considered to be a subset of ARP interleavers as explained in Garzón Bohórquez et al. "On the equivalence of interleavers for turbo codes," *IEEE Wireless Communication Letters*, vol. 4, no 1, pp. 58-61, February 2015, applies a local permutation to groups of W bits before the overall regular interleaving is done, and then applies a new permutation on the groups of R bits before definitive reading.

The QPP interleaver, considered to be a particular case of the ARP interleaver as explained in the article mentioned here above by Garzón Bohórquez et al., is based on a quadratic polynomial permutation:

$$\Pi(i)=(f_1 i+f_2 i^2) \bmod K,$$

where $i=0 \ldots K-1$ represents the address of the information symbol after interleaving and $\Pi(i)$ is the address of the same information symbol before interleaving.

The ARP interleaver has been adopted in the DVB-RCS/RCS2, DVB-RCT and WiMAX (IEEE 802.16) standards, while the QPP interleaver is used in the LTE and LTE-Advanced mobile communications standards.

Whatever the family of interleaver adopted, it is necessary to find the parameters that give the interleaver good properties of distance and therefore a flare region that is as low as possible. Ideally, since the elementary codes of the turbocode are fixed, the values of these parameters must be computed for each size K of the block of the message to be encoded and for each encoding rate value.

However, the process of searching for these parameters proves in practice to be cumbersome and consumes computation power, because for each set of parameters considered, it is necessary either to simulate the behavior of the turbocode at low error rates in order to detect the position of the flare region or to estimate its distance spectrum by means of methods such as those described in C. Berrou et al., "*Computing the minimum distance of linear codes by the error impulse method*," IEEE Global Telecommun. Conf., vol. 2, November 2002, pp. 1017-1020, or by R. Garello and A. Vila-Casado, "*The all-zero iterative decoding algorithm for turbo code minimum distance computation*," IEEE International Conference on Communications (ICC), vol. 1, June 2004, pp. 361-364, or the articles by S. Crozier et al. "*Estimating the minimum distance of turbo-codes using double and triple impulse methods*", IEEE Commun. Lett., vol. 9, No. 7, pp. 631-633, 2005, or "*Estimating the minimum distance of large-block turbo codes using iterative multiple-impulse methods,*" 4th Int. Symposium on Turbo Codes and Related Topics (ISTC), 2006, pp. 1-6, or "Estimating the minimum distance of large block turbo codes using the event impulse method" Int. Symposium on Turbo Codes and Iterative Information Processing (ISTC), September 2010, pp. 439-443.

Thus, in practice, in the standards using ARP and QPP interleavers, for each block size K, the interleaving parameters do not depend on the encoding rate and the turbocodes obtained do not have high performance in terms of correction for all the coding rate values, especially for the high rate values.

Given the present limitations of turbocodes, described here above, there is a need to improve the performance of information symbols encoding that implement a turbo-encoder.

SUMMARY OF THE INVENTION

The invention proposes a novel solution for the encoding of an input digital message bearing K information symbols in the form of an encoding method using a turbo-encoder forming a turbocode, the turbo-encoder comprising an interleaver and first and second encoders for encoding according to at least one elementary code, delivering the information symbols (interleaved or not) and redundancy symbols.

According to the invention, since a puncturing of the symbols delivered by the turbo-encoder (information symbols and/or redundancy symbols) is done according to at least one periodic puncturing pattern of a length N, defining the puncturing period N, said interleaver distributes the information symbols of said input message into Q layers of the interleaved input message in complying with an interleaving function defined from said at least one puncturing pattern, according to the relationship:

$$\pi(i)=Pi+S(i \bmod Q) \bmod K=Pi+S(l) \bmod K=Pi+(T_l+A_l Q) \bmod K$$

with:
- i=0, ..., K−1 the position of an information symbol in said interleaved input message, in the interleaved order and π(i) the position of said information symbol in said input message, in the natural order;
- P is an integer value co-prime with the length K of said input message, called the interleaver period;
- S(i mod Q)=S(l)=$T_l+A_lQ$ are the parameters of adjustment of the interleaving function, with l=0, ..., Q−1 the number of the layer;
- Q is the degree of disorder inserted into the interleaver, corresponding to the number of layers, such that Q=qN, with q≥1 being an integer and Q being a divider of K (P and K being mutually prime numbers and K being a multiple of Q, it is noted that P and Q are mutually prime numbers);
- $T_l$ is a value of inter-layer adjustment defined from said at least one puncturing pattern; and
- $A_l$ is a value of intra-layer adjustment.

The interleaving implemented by the turbo-encoder according to the invention thus takes account of the puncturing pattern or patterns used to ingeniously interleave the information symbols of the input message and improve encoding/decoding performance.

It can be noted that the information symbols of the input message can be considered to be distributed, before interleaving, into Q layers (or subsets) of K/Q information symbols. The interleaving enables especially the conversion of a layer of information symbols of the input message into another layer of information symbols of the interleaved input message. In other words, the interleaver defines Q layers (or subsets) of information symbols that are associated with Q different values of adjustment parameters S(l).

More specifically, the expression of the interleaver according to the mathematical model π(i)=Pi+($T_l+A_lQ$) mod K shows the implementation of a two-level interleaving: each layer of the non-interleaved input message is converted by interleaving into another layer of the interleaved input message (identical or different layer) and a position of a symbol in a non-interleaved input message layer is converted by interleaving into another position in a layer of the interleaved input message (identical or different position).

More specifically, the value of inter-layer adjustment $T_l$ enables the fixing of the correspondence between the layer numbers of the non-interleaved input message on the one hand and the layer numbers of the interleaved input message on the other hand, $T_l$∈(0, ..., Q−1), in complying with connection rules defined on the basis of the puncturing pattern or patterns. The inter-layer adjustment value $T_l$ can thus be built deterministically.

For example, if the symbols of the input message are considered to be distributed among Q layers (for the natural order and the interleaved order) and if j denotes the address of a symbol in the non-interleaved input message and i is its address in the interleaved input message (j=π(i)), then in the non-interleaved input message, the symbol belongs to the layer j mod Q, and in the interleaved input message the symbol belongs to the layer i mod Q.

In other words, if the address symbol i in the interleaved input message (interleaved order) is situated in the layer l, the corresponding symbol in the non-interleaved input message (natural order) comes from the layer (P×l+$T_l$) mod Q (i.e. the layer number of π(i)).

The intra-layer adjustment value $A_l$ fixes for its part the position of a symbol in the layer (P×l+$T_l$) mod Q before interleaving (l being the layer number after interleaving), $A_l$∈(0, ..., (K/Q)−1).

It can be noted that the interleavers ARP, DRP or QPP especially can be modelled in the form of an ARP interleaver according to the mathematical model π(i)=Pi+S(i mod Q) mod K, and consequently according to the mathematical model π(i)=Pi+($T_l+A_lQ$) mod K according to the invention.

It can be noted besides that different puncturing patterns can be used to puncture the information symbols, the redundancy symbols obtained from the first encoder and the redundancy symbols obtained from the second encoder. For example, a first puncturing pattern can be used to puncture the information symbols, a second puncturing pattern can be used to puncture the redundancy symbols obtained from the first encoder and a third puncturing pattern can be used to puncture the redundancy symbols obtained from the second encoder. These different patterns, whether identical or different, have an identical length equal to N, also called a puncturing period.

In particular, since a puncturing of the information symbols delivered by the turbo-encoder is done according to a puncturing pattern with a length N, the value of inter-layer adjustment $T_l$ makes the punctured information symbols correspond with one another, i.e. in their position in the natural order and their position in the interleaved order.

In this way, the interleaver complies with the connection rule according to which the interleaving function converts the punctured position of an information symbol in the natural order into a punctured position for the corresponding interleaved information symbol.

An interleaver according to the invention can especially be built by implementing a method for building an interleaver for a turbo-encoder forming a turbocode that is designed to encode an input digital message. The turbo-encoder comprises first and second encoders for encoding according to at least one elementary code. According to one embodiment the first encoder forms a first set of information symbols and redundancy symbols from the input message and the second encoder forms a second set of information symbols and redundancy symbols from the input message interleaved by the interleaver. The symbols transmitted by the two encoders are punctured according to a puncturing pattern of a length N defining the puncturing period N.

The method consists in:
a) establishing an interleaving function of the interleaver as a function of the puncturing pattern, in determining the degrees of fragility of the different positions within the pattern and connecting the positions according to at least one connection rule of said interleaving function dependent on the degree of fragility of the positions,
b) determining a restricted set of candidates for the adjustment parameters of the interleaving function determined in a) as a function of predefined values of the minimum cumulative spatial distance $S_{min}$ and the length of the minimum correlation cycle $G_{min}$ of the interleaver for at least one interleaver period, and
c) selecting at least one interleaver among the limited set of candidates of the step b) on the basis at least of the distance spectra of the turbocodes obtained in using the corresponding interleavers.

The degree of fragility of a position, defined here below, depends on the minimum Hamming distance of the distance spectrum of the elementary codes and/or the number of redundancy symbols punctured in the case of a position for which the information symbol is punctured.

The method for building the interleaver thus takes account of the puncturing pattern during the building of the interleaving function of the turbocode, thus making it possible to significantly reduce the space of searching for interleaving parameters and obtain an interleaver that shows major improvements in performance at a low error rate as compared with known methods, for example 0.5 to 1.5 dB of typical gain as compared with the LTE code.

The turbocode formed according to the invention can belong to the same family of standardized codes as the codes used in third-generation mobile telephony standards, known as "3G", and fourth generation standards known as "4G", but has significantly improved performance for equivalent complexity.

According to this novel method, the interleaving parameters determined are adapted to each encoding rate R. The interleaving function furthermore makes it possible to preserve the structure of the puncturing patterns equally well for the information symbols and for the redundancy symbols.

Establishing the rule or rules of connection of the interleaving function according to the degree of fragility of the positions of the puncturing pattern enables the corrective power of the turbocode to be distributed over all the information symbols and is aimed at compensating for defects of protection of each elementary code relative to certain information symbols within the message to be encoded, especially in the puncturing period.

Such a method of building the interleaver considerably reduces the space of search for adjustment parameters of the interleaving function when the search is compared with exhaustive or random searching.

Selecting the Puncturing Pattern

The puncturing is thus periodic and is repeated according to the pattern of length N defining the puncturing period.

Should each elementary code produce a single redundancy output, the puncturing pattern associated with each elementary code is, in a known way, constituted by two vectors of a length N, one for the puncturing of the information symbols and the other for the puncturing of the redundancy symbols. Should each elementary code produce several redundancy outputs, the puncturing pattern is then constituted by a greater number of vectors, depending on the number of redundancy outputs, for example r+1 puncturing vectors of a length N for r redundancies of the elementary code.

The encoding rate R of a turbocode can be expressed as:

$$R = \frac{N}{N(1 - R_{pd}) + 2N_{np}},$$

with $R_{pd}$ being the ratio of information symbols punctured during the period N, and $N_{np}$ being the number of non-punctured redundancy symbols per elementary code in the period N.

The values of the rate R and the period N of the pattern being fixed, the ratio $R_{pd}$ can take N+1 possible values:

$$R_{pd} = \frac{n}{N}, n = 0, \ldots, N.$$

In practice, only the values leading to rates $R_C$ of elementary codes below 1 are permissible. If not, the corresponding elementary decoders are not capable of rebuilding the message transmitted on the basis of the symbols received.

In other words, the permissible limit corresponds to the case where the total number of information symbols and redundancy symbols delivered by the elementary codes become smaller than the size K of the input message.

The puncturing pattern is for example selected independently of the interleaver.

According to one embodiment, the puncturing pattern is selected preliminarily from a plurality of puncturing patterns corresponding to different permissible values of the ratio $R_{pd}$ of information symbols punctured during the puncturing period N. The selection is made on the basis of at least a comparison between the distance spectra of the corresponding punctured elementary codes and measurements of mutual information exchanged between input and output extrinsic information of the decoder corresponding to the encoder should these puncturing patterns be used with a uniform interleaver.

According to one embodiment, for each value of a puncturing period N and of the ratio $R_{pd}$, a value representing a distance of the distance spectrum of the punctured elementary code, corresponding especially to the minimum Hamming distance, is used for the comparison between the distance spectrum of the punctured elementary code, the puncturing pattern leading to the greatest value of distance being selected.

To this end, for each value of a period N selected and for each value of the ratio $R_{pd}$, it is possible to consider all the puncturing patterns possible and, for each of them, determine the start of the distance spectrum of the punctured elementary code, i.e. the minimum Hamming distance of the code and the immediately greater distances as well as their multiplicity. It is possible to use the FAST algorithm described in M. Cedervall and R. Johannesson, "*A fast algorithm for computing distance spectrum of convolutional codes*" IEEE Trans. Inf. Theory, vol. 35, No. 6, pp. 1146-1159, November 1989, and adapted to the punctured codes.

With several puncturing patterns leading to the same greater value of distance for a same value of puncturing period N and a same value of the ratio $R_{pd}$, a selection is made of the pattern for which the multiplicity is minimum.

With several puncturing patterns leading to the same value of minimum multiplicity corresponding to a same greater value of distance, for a same value of period N and a same value of the ratio $R_{pd}$, the pattern-selecting process is reiterated for the following distance, i.e. the immediately greater distance in the distance spectrum of the punctured elementary code.

This first part of the selection of the puncturing pattern enables elimination of patterns known as catastrophic patterns.

For each value of the period N and of the ratio $R_{pd}$, for example, the puncturing pattern leading to a value of mutual information exchanged that is greater than or equal to the information obtained when the ratio $R_{pd}$ of the punctured information symbols is zero is selected from among the previously selected patterns.

The uniform interleaver used to compute the values of mutual information exchanged is a probabilistic interleaver that produces equiprobably all the possible interleavings for a size K of information sequence. It does so, for example, by random draw for each sequence transmitted, and as described in the article by S. Benedetto and G. Montorsi, "*Unveiling turbo codes: some results on parallel concatenated coding schemes*" IEEE Trans. Inf. Theory, vol. 42, No. 2, pp. 409-428, 1996. The uniform interleaver enables an evaluation of the average performance of the turbocode independently of the choice of the interleaver.

The decoder corresponding to a uniform interleaver of the turbocode can be simulated for the puncturing patterns selected at the pervious step, in order to compare the curves of error rates obtained.

According to one particular embodiment, the puncturing pattern selected is the one offering the best compromise between performance at high and average error rates in the waterfall region and performance at low error rates in the flare region, depending especially on the application in view.

In particular, the puncturing period N is a divider of the length K of the input digital message. This limits the edge effects related to puncturing.

In order to limit the search space of the interleavers, it may be advantageous in practice, for the period N, to consider only the smallest dividers of the size K of the input digital message, for example if K is divisible by 256, only the puncturing periods equal to 8 or 16 can be considered.

The puncturing patterns are preferably identical for the two elementary codes forming the turbocode, especially if the elementary codes are identical.

Interleaving Function

The interleavers used in the invention belong preferably to the family of ARP interleavers. The invention however is not limited to one particular type of interleaver. In particular, as already indicated, the DRP or QRP interleavers can be modelled in the form of ARP interleavers.

In a known way, since the information symbols used both at input of the elementary code C1 and at input of the elementary code C2 are transmitted only once, a punctured symbol for one of the codes must necessarily be punctured for the other code. The interleaving function therefore converts the punctured position of an information symbol in the natural order into a punctured position for the corresponding interleaved information symbol, as represented in FIG. 8, for a puncturing period N equal to 8. This rule is described especially in the articles by S. Crozier et al. mentioned here above and in the US patent application 2007/0288834. This rule does not apply to the redundancy symbols, each redundancy symbol being proper to a single code.

Degrees of Fragility

Determining the degree of fragility of each position of the information symbol relative to an elementary code within the message to be encoded in the puncturing period can depend on whether it is a position for which the information symbol is punctured or not. In other words, the procedure implemented is different if the position of the information symbol in the input message corresponds to a position in which the information symbol is punctured or a position for which the information symbol is not punctured.

In the case of positions for which the corresponding information symbol is not punctured, the degree of fragility of the positions is for example determined on the basis of at least one comparison of the distance spectra of the elementary codes obtained in puncturing each of the non-punctured information symbols one by one, the least fragile position corresponding to the spectrum having the greatest minimum Hamming distance and the lowest multiplicity and the most fragile position corresponding to the spectrum having the smallest minimum Hamming distance and the greatest multiplicity.

In the event of equality between the minimum Hamming distance and the multiplicities, the comparison is reiterated for the immediately greater distance in the distance spectrum.

A ranking of the positions according to their degree of fragility can be made, one example of which is shown in FIG. 9, for a puncturing pattern with a length N=8. The value "1" corresponds to the least fragile position, the value "6" to the most fragile position.

In the case of positions for which the information symbol is punctured, the degree of fragility of the positions is for example determined as a function of the number of punctured redundancy symbols, the least fragile positions being those for which no redundancy symbol is punctured and the most fragile positions being those for which all the redundancy symbols are punctured. The intermediate degrees of fragility can be determined as a function of the number of redundancy symbols punctured, the position being all the more fragile as the number of redundancy symbols punctured is great.

FIG. 10A illustrates an example of determining of the degrees of fragility of positions for which the information symbol is punctured, for a puncturing pattern with a length N=8. Two classes of degrees of fragility are determined by the number of redundancy symbols punctured: the positions identified in dashed lines, correspond with a punctured redundancy symbol, are more fragile than the positions identified by unbroken lines corresponding to no punctured redundancy symbol.

The degrees of fragility of the positions having the same number of punctured redundancy symbols can be determined from at least one comparison of the distance spectra of the elementary codes obtained by puncturing non-punctured redundancy symbols one by one, the least fragile position corresponding to the spectrum having the greatest minimum Hamming distance and the lowest multiplicity, and the most fragile position corresponding to the spectrum having the lowest minimum Hamming distance and the greatest multiplicity.

FIG. 10B illustrates this step on the basis of the example of FIG. 10A in showing the ranking by increasing degree of fragility of the positions identified by dashed lines and unbroken lines, and the final overall ranking. The value "1" corresponds to the least fragile position and the value "6" to the most fragile position.

If several redundancy symbols are non-punctured, they can be punctured one by one, the distance spectrum being determined for each of them and a final ranking of the positions according to their degree of fragility taking account of all the spectra obtained for each of the positions.

A ranking of all the positions according to their degree of fragility can be done.

Connection Rules

According to a first connection rule of the interleaving function, for the positions for which the information symbol is not punctured, the most fragile positions are connected to the least fragile positions, the most fragile position being especially connected to the least fragile position, the second most fragile position being especially connected to the second least fragile position, and so on and so forth as shown in FIG. 11 for a puncturing pattern of a length N=8.

According to a second rule of connection of the interleaving function, for the positions for which the information symbol is punctured, the most fragile positions are connected to the least fragile positions, the most fragile position being especially connected to the least fragile position, the second most fragile position being especially connected to the second least fragile position, and so on and so forth, as shown in FIG. 12 for a puncturing pattern of a length N=8.

These connection rules are complementary with the rule described here above according to which the interleaving function converts the punctured position of an information symbol in the natural order into a punctured position for the corresponding interleaved information symbol. These connection rules can be applied jointly or not jointly.

Each connection rule can relate to a limited number of positions or set of positions to arrive at a complete cross connection.

Adjustment Parameters

According to one particular embodiment, the predefined value of the minimum cumulative spatial distance $S_{min}$ of the interleaver is smaller than or equal to the greatest integer smaller than the square root of twice the length K of the input digital message $S_{min}=\lfloor\sqrt{2K}\rfloor$, and the predefined value of the length of the minimum correlation cycle $G_{min}$ of the interleaver is smaller than or equal to Moore's theoretical limit $\lfloor 2 \log_3 (K) \rfloor$.

As defined in the article by N. Biggs "Minimal regular graphs with given girth", Algebraic graph theory, Cambridge University Press, 1974, pp. 180-190, in a regular graph where all the nodes have the same number of neighbors, Moore's limit corresponds to a minimum cycle length smaller than or equal to 2 $\log_{r-1}(S)$, where r is the degree of the graph, i.e. the number of neighbors of each node and S is the number of nodes of the graph. In the case of the interleaver of a turbocode, r is equal to 4 and S=K, $G_{min}$ therefore accepts the following as an upper Moore's limit: $\lfloor 2 \log_3(K) \rfloor$.

The minimum cumulative spatial distance or "minimum span" is used to measure the capacity of the interleaver to efficiently disperse the error packets.

The cumulative spatial distance of a pair of symbols is defined as the sum of the spatial distance between the two symbols before and after interleaving.

Should the code be circular, the cumulative spatial distance is expressed as:

$$S(i,j)=f(i,j)+f(\Pi(i),\Pi(j)),$$

where $$f(u,v)=\min[|u-v|,K-|u-v|].$$

The minimum cumulative spatial distance of the interleaver is then equal to:

$$S_{min} = \min_{i,j\in[0,...K-1]\,i\neq j}[S(i,j)].$$

The predefined value of the minimum cumulative spatial distance corresponds to the upper limit of this distance demonstrated in the article by E. Boutillon and D. Gnaedig, "*Maximum spread of D-dimensional multiple turbo codes,*" IEEE Trans. Commun., vol. 53, No. 8, pp. 1237-1242, 2005.

The length of the minimum correlation cycle $G_{min}$, or minimum girth of the interleaver comes from the building of the graph of correlation between the sequence of symbols in the natural order and the sequence of symbols in the interleaved order, described in the article by Y. Saouter, "*Selection procedure of turbocode parameters by combinatorial optimization*", Int. Symposium on Turbo Codes and Iterative Information Processing (ISTC), September 2010, pp. 156-160.

In the iterative decoding process of a turbocode, a high level of correlation between the encoded symbols can induce a deterioration of the code correction performance by error propagation in the course of the iterations. The symbol decoded by one of the decoders at the position i in the message depends on the symbol received at the position i, the symbols received at the positions neighboring i and the extrinsic information pertaining to the symbol i coming from the other decoder by means of the interleaver.

The level of correlation in the decoding process is all the weaker as the cycles of the correlation graph are lengthy. The length of the minimum correlation cycle $G_{min}$ corresponds to the length of the shortest cycle of the correlation graph. This value is bound by Moore's limit as explained in the article by N. Biggs, "*Minimal regular graphs with given girth*", Algebraic graph theory, Cambridge University Press, 1974, pp. 180-190. In addition, it is preferable not to have excessively low values to limit the effects of the correlation. For messages to be encoded of a length greater than or equal to 1000 bits, a minimum value of correlation cycle length equal to 8 can be sufficient. For shorter messages, it is preferable to obtain minimum values as close as possible to Moore's limit, a difference of three points below the limit being acceptable.

Here below, the gradual building of the interleaving function will be illustrated in graph form as represented in FIGS. 13A and 13B. This representation makes it easy to introduce the connection rules related to puncturing, gradually build the interleaver and at each step verify the values of minimum cumulative spatial distance $S_{min}$ and the length of the minimum correlation cycle $G_{min}$ of the interleaver. FIG. 13A corresponds to the case of a circular code, the addresses within the circle representing the positioning of the information symbols in the non-interleaved natural order and the addresses outside the circle representing the positions of the same information symbols after interleaving. FIG. 13B corresponds to the case of a non-circular code, the lower addresses representing the placing of the information symbols in the non-interleaved natural order and the upper addresses representing the positions of the same information symbols after interleaving.

The mathematical model of the ARP interleaver can lead to:

$$\Pi(i+Q) \bmod Q = \Pi(i) \bmod Q.$$

With the value of the degree of disorder Q being determined, it is possible to assemble or group together the interleaving addresses in Q layers, as shown in FIG. 14 in the particular case of an input message of a length K=4Q, and to process the layers one after the other for the choice of the adjustment parameters of the interleaver.

For example, the degree of disorder Q of the interleaver is a multiple of the puncturing period N. Here below, it is accepted that Q=N. Should Q=qN, q>1, it is possible to concatenate q identical puncturing patterns to arrive at the length Q. Given that $\Pi(i+Q)$ mod $Q=\Pi(i)$ mod Q, the validation of the puncturing rules over a period Q is a sufficient condition for it to be validated on the totality of the input message.

The adjustment parameters S(l) of the interleaving function can be expressed by $S(l)=T_l+A_l\cdot Q$, with l=0, ..., Q−1 being the layer number after interleaving, $T_l$ being the inter-layer component, $A_l$ the intra-layer component, and Q the degree of disorder inserted into the interleaver corresponding to the number of layers. This enables the covering of all the possible addresses for each layer. The inter-layer adjustment $T_l$ fixes the correspondence between the layers number before and after interleaving, each layer being converted by interleaving into another layer, as represented in FIG. 15, while the inter-layer adjustment $A_l$ defines the rotation made by the interleaving within a layer (i.e. the position of a symbol within a layer) as represented in FIG. 16 for the layer l=0 and K=4Q.

The value of each adjustment parameter S(l) is preferably obtained by separately selecting the value of the inter-layer adjustment $T_l$ and the value of the intra-layer adjustment $A_l$.

As shown in FIG. 17, for Q=8, a link can be set up between the connected positions forming a connection mask and the value of the inter-layer adjustment $T_l$:

$$\{(l,(P \times l+T_l) \bmod Q), l=0, \ldots, 7\} = \{(0,2),(1,4),(2,0),\\(3,5),(4,1),(5,3),(6,7),(7,6)\}.$$

To comply with the connection rule according to which the interleaving function converts the punctured position of an information symbol in the natural order into a punctured position for the corresponding interleaved information symbol, it is possible to consider only the inter-layer adjustment values $T_l$ that make the punctured information symbols correspond with each other. To comply with the first connection rule, it is possible to consider only the inter-layer adjustment values $T_l$ that make the positions of the most fragile non-punctured information symbols correspond with the positions of the least fragile non-punctured information symbols. To comply with the second connection rule, it is possible to consider only the values of the inter-layer adjustment $T_l$ that make the positions of the most fragile punctured information symbols correspond with the positions of the least fragile punctured information symbols. This reduces the space of searching for the inter-layer adjustment values $T_l$ and for the adjustment vector $S=(T_0+A_0Q, T_1+A_1Q, \ldots, T_{Q-1}+A_{Q-1}Q)$.

The interleaver period P is for example an integer value co-prime with the length K of the input digital message adapted to ensuring a minimum cumulative spatial distance value $S_{min}$ of the interleaver greater than or equal to the minimum cumulative spatial distance if the interleaver is regular.

For each value of the interleaver period P, an interleaving graph can be established by integrating the interleaving connections as and when the adjustment parameters S(l) are determined according to the interleaving function, for each layer l, in controlling the values of minimum spatial cumulated distance $S_{min}$ and of length of the minimum correlation cycle $G_{min}$ of the interleaver.

Initially, only the positions corresponding to the non-interleaved information symbols are preferably presented, the interleaving connections being added as and when the values of S(l) are chosen for each value of l=0 . . . Q–1, depending on the connection rules related to the puncturing pattern. For each value of the parameter S(l), the values of minimum spatial cumulated distance $S_{min}$ and of length of the minimum correlation cycle $G_{min}$ can be computed. If they are greater than or equal to the predefined values, the process passes to the next layer l+1. If not, another value of the parameter S(l) is tested.

The process of building the interleaving graph is preferably continuous until the last layer, corresponding to l=Q–1.

If the process of building the interleaving graph does not converge, i.e. if a set of parameters S(l) that satisfies the interleaving function and leads to permissible values of minimum cumulative spatial distance $S_{min}$ and of length of the minimum correlation cycle $G_{min}$, is not found, then the process can be reiterated for the next value of the interleaver period P.

If the process does not converge for any of the values of the interleaving period P, one of the predefined values of minimum cumulative spatial distance $S_{min}$ and of length of minimum correlation cycle $G_{min}$ can be reduced, and the process relaunched.

The distance spectrum of the turbocodes obtained by using the interleavers of the restricted set of candidates obtained can be estimated. The process selects for example the interleaver leading to a distance spectrum presenting at least the greatest value of minimum distance and especially the lowest multiplicity. In the event of equality, the immediately greater distance is considered.

A similar approach can be applied to restricting the choice of the adjustment parameters for other families of interleavers, for example for the choice of the parameters f1 and f2 of a QPP interleaver, adopted in the LTE standard.

According to another of its aspects, the invention also relates to an interleaver for a turbo-encoder forming a turbocode intended for encoding a digital input message used for the encoding method according to the invention.

Elementary Codes

According to one particular embodiment, the two elementary codes of the first and second encoders of the turbo-encoder are identical.

According to one particular embodiment, the elementary codes of the first and second encoders of the turbo-encoder are circular.

The efficiency of the circular codes in known. Indeed, most communications systems implement a transmission of information by blocks. Convolutive codes and therefore turbocodes, are well suited to the transmission of data by blocks provided that the corresponding decoders can determine the state of the encoders at the beginning and at the end of the encoding of the block of information, called a "trellis termination". Among the different known techniques of trellis termination, the circular encoding technique known as "tail biting" can advantageously be applied to turbocodes. In this technique, described in the articles by H. Ma and J. K. Wolf "*On tail-biting convolutional codes*", IEEE Trans. Commun., vol. 34, no 2, pp. 104-111, 1986, and by C. Weiss et al., "*Turbo decoding with tail-biting trellises*", URSI Intern. Symp. on Signals, Systems, and Electronics (ISSSE), October 1998, pp. 343-348, and "*Code construction and decoding of parallel concatenated tail-biting codes*", IEEE Trans. Inform. Theory, vol. 47, pp. 366-386, January 2001, the encoding trellis of each of the elementary codes is made circular, i.e. the initial state and the final state of encoding of the information block are identical.

Circular encoding has been adopted in standards such as DVB-RCS/RCS2, DVB-RCT and WiMAX. This technique represents the best method of trellis termination for turbo-codes because it introduces neither loss of spectral efficiency nor any edge effect in the encoding and iterative decoding of the message transmitted. All the information symbols are therefore protected identically for the turbocode before puncturing, and the property of circularity averts the presence of less significant truncated code words as often happens with termination symbols, for example in turbo-codes adopted under the 3G, LTE and LTE-Advanced standards. In addition, since the termination produces no position in the trellis requiring particular processing, the designing of the interleaver is thereby simplified.

The elementary codes of the first and second encoders of the turbo-encoder can be the CSR(13, 15)$_8$, or the CSR(13, 15, 17)$_8$ codes.

Computer Program Product

The invention, according to another of its aspects, also relates to a computer program for implementing the encoding method described here above, downloadable from a communications network and/or recorded on a computer-readable support and/or executable by a processor.

A computer program product can also be defined for the implementing of the method of building an interleaver, downloadable from a communications network and/or recorded on a computer-readable support and/or executable by a processor, the turbo-encoder comprising first and second encoders for encoding according to at least one elementary code, according to one embodiment the first encoder forming, from the input message, a first set of information symbols and redundancy symbols, the second encoder forming, from the input message interleaved by the interleaver, a second set of information symbols and redundancy symbols, a puncturing of the symbols transmitted by the two encoders being carried out according to the puncturing pattern of length N, the computer program product comprising code instructions which, executed on a processor, cause the following:

a) an interleaving function of the interleaver is established as a function of the puncturing pattern, in determining the degrees of fragility of the different positions within the pattern and connecting the positions according to at least one connection rule of said interleaving function dependent on the degree of fragility of the positions, b) a restricted set of candidates is determined for the parameters of adjustment of the interleaving function determined at a) as a function of the predefined values of minimum spatial cumulated distance and of the length of the minimum correlation cycle of the interleaver for at least one interleaver period, and c) at least one interleaver is selected from among a restricted number of candidates of the step b) on the basis of at least the distance spectra of the turbocodes obtained in using the corresponding interleavers.

The characteristics described here above for the method can be applied to the computer program product.

Turbo-Encoder

The invention also relates, according to another of its aspects, to a turbo-encoder implementing the encoding method described here above.

Such a turbo-encoder can of course comprise the different characteristics of an encoding method according to the invention, which can be combined or taken in isolation. Thus, the characteristics and advantages of this turbo-encoder are the same as those of the encoding method and shall not be described in more ample detail.

In particular, the turbo-encoder is obtained by implementing the method comprising the steps of:

a) selecting, for each encoder, a puncturing pattern of a length N from among a plurality of puncturing patterns corresponding to different permissible values of the ratio $R_{pd}$ of information symbols punctured during the puncturing period N defined by the length of the pattern, on the basis of at least a comparison between the distance spectra of the corresponding punctured elementary codes and measurements of mutual information exchanged between the extrinsic information input and output from the decoder corresponding to the encoder should these puncturing patterns be used with a uniform interleaver, b) setting up an interleaving function of the interleaver as a function of the selected puncturing pattern in determining the degrees of fragility of the different positions within the pattern and connecting the positions according to at least one connection rule of said interleaving function, depending on the degree of fragility of the positions, c) determining a restricted set of candidates for the parameters of adjustment of the interleaving function determined at b) as a function of a predetermined values of the minimum spatial cumulated distance and of the length of the minimum correlation cycle of the interleaver, for at least one interleaver period, and d) selecting at least one interleaver among the restricted set of candidates of the step c) on the basis at least of distance spectra of the turbocodes obtained by using the corresponding interleavers.

The characteristics defined here above for the method apply to the turbo-encoder.

Method of Transmission

The invention also relates according to another of its aspects to a method of transmission of a digital message encoded by using a turbo-encoder according to the invention and intended to be transmitted via a transmission channel.

BRIEF DESCRIPTION OF THE DRAWINGS

The invention can be understood more clearly from the following detailed description of non-exhaustive examples of implementation of the invention and from the appended drawings, of which.

DETAILED DESCRIPTION OF ILLUSTRATIVE EMBODIMENTS

Figure 1A:
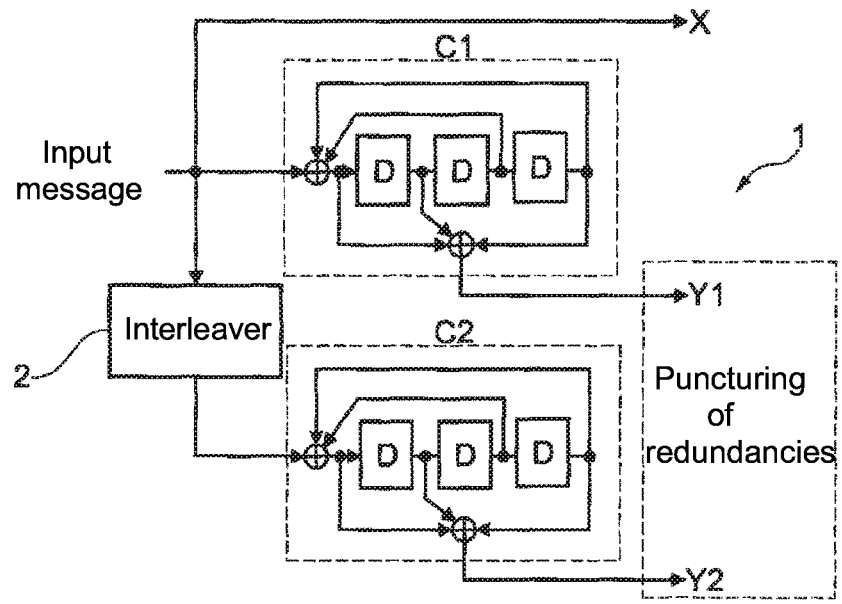
FIG. 1A, described here above, represents the structure of a turbo-encoder according to the prior art.
Figure 2:
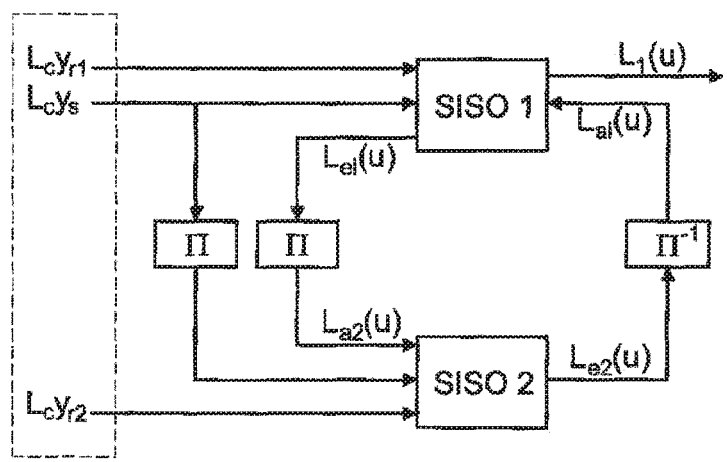
Figure 1B:
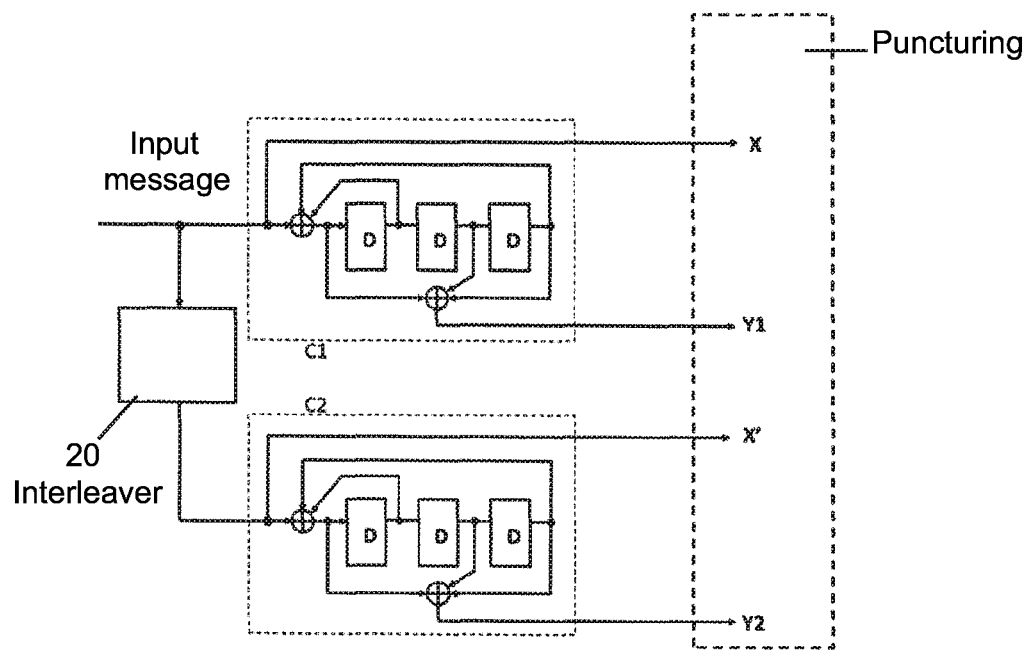
FIGS. 1B and 1C represent the structure of a turbo-encoder according to different embodiments of the invention, FIG. 2, described here above, illustrates the iterative decoding of a turbocode according to the prior art, FIG. 3, described here above, represents the curves of error rates of a turbocode decoded iteratively according to the prior art, FIG. 4, described here above, represents an interleaver of a turbocode with elementary circular codes according to the prior art.
Figure 1C:
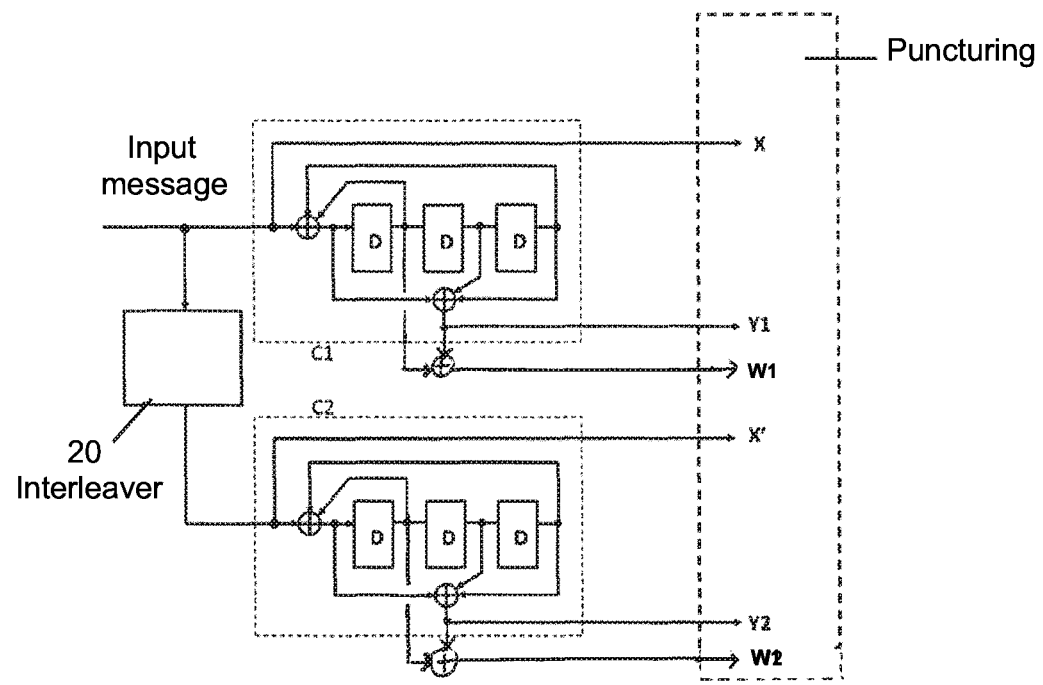
Figure 3:
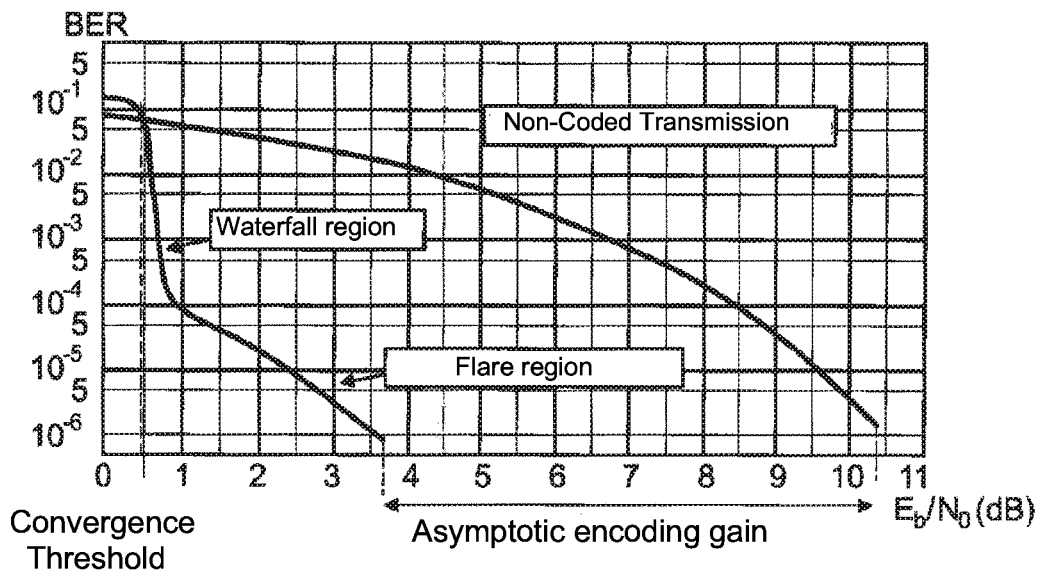
Figure 4:
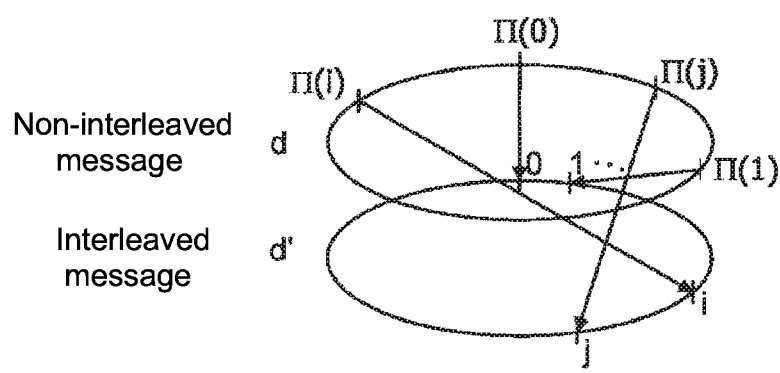

FIGS. 1B and 1C show the structure of a turbo-encoder according to the invention, outputting information symbols (interleaved or non interleaved) and redundancy symbols, and a puncturing of the information and/or redundancy symbols, for an encoding rate of $R \geq 1/3$ and $1/3 > R \geq 1/5$ respectively.

The turbo-encoder illustrated in FIG. 1B comprises an interleaver 20 and two encoders, for example of the recursive systematic convolutive type (C1, C2), each producing a systematic output (information symbols X in the natural order for the first encoder C1 or information symbols X' in the interleaved order for the second encoder C2) and a redundancy output (redundancy symbols Y1 for the first encoder C1, and redundancy symbols Y2 for the second encoder C2). The input digital message, comprising K information symbols is encoded in its order of arrival, called a natural order, by the encoder C1, and in the interleaved order or permutated order by the encoder C2.

The output digital message comprising the systematic output (information symbols X or else information symbols X') and the redundancy output (redundancy symbols Y1 and Y2) can be punctured according to at least one periodic puncturing pattern of a length N. For example, for each encoding rate greater than 1/3, three puncturing patterns of a length N are used, each expressed for example in the form of a binary vector: a first puncturing pattern used for the puncturing of the information symbols X or X', a second puncturing pattern used for the puncturing of the redundancy symbols Y1 and a third puncturing pattern used for the puncturing of the redundancy symbols Y2. If the elementary codes of the first and second encoders (C1, C2) of the turbo-encoder are identical, the same puncturing pattern can be applied to the redundancy symbols Y1 and to the redundancy symbols Y2.

The turbo-encoder illustrated in FIG. 1C comprises an interleaver 20 and two encoders, for example of the recursive systematic convolutive type (C1, C2) each producing a systematic output (information symbols X in the natural order for the first encoder C1, or information symbols X' in the interleaved order for the second encoder C2) and two redundancy outputs (redundancy symbols Y1 and W1 for the first encoder C1, and redundancy symbols Y2 and W2 for the second encoder C2). The input digital signal comprising K information symbols is encoded in its order of arrival, called a natural order, by the encoder C1 and, in the interleaved or permutated order by the encoder C2.

The output digital message comprising the systematic output (information symbols X or else information symbols X') and the two redundancy outputs (redundancy symbols Y1 and W1 obtained from the first encoder and redundancy symbols Y2 and W2 obtained from the second encoder), can be punctured according to at least one periodic puncturing pattern of a length N. For example, for each encoding rate of 1/5 to 1/3, five puncturing patterns of a length N are used, expressed for example in the form of a binary vector: a first puncturing pattern used for the puncturing of the informa- $R_{pd}$=2/8, the resulting information/redundancy symbols being 01111110/11000001. The case $R_{pd}$=0/16 and 8/16 can more simply be represented by means of N=4, giving $R_{pd}$=0/4 and 2/4, the resulting information/redundancy symbols being 1111/1000 for $R_{pd}$=0/4 and 1100/1001 for $R_{pd}$=2/4.

| $R_{pd}$ | $R_c$ | $A_0$ | $A_1$ | $A_2$ | $A_3$ | $A_4$ | Puncturing pattern: information/redundancy symbols |
|---|---|---|---|---|---|---|---|
| 0/16 | 0.8 | 0 | 0 | 0 | 9 | 48 | 1111111111111111/1000100010001000 |
| 2/16 | 0.84 | 0 | 0 | 2 | 49 | 344 | 1111111110111011/0100000101001100 |
| 4/16 | 0.88 | 0 | 0 | 3 | 62 | 566 | 0111111001111110/1100000111000001 |
| 6/16 | 0.94 | 0 | 0 | 21 | 424 | 7490 | 1110101110101010/0001010001110101 |
| 8/16 | 1.0 | 0 | 4 | 38 | 358 | 3310 | 1100110011001100/1001100110011001 |
| 10/16 | 1.06 | 1 | 25 | 342 | 4804 | 66643 | 1110000010010100/1110100110110010 | tion symbols X and X', a second puncturing pattern used for the puncturing of the redundancy symbols Y1, a third puncturing pattern used for the puncturing of the redundancy symbols Y2, a fourth puncturing pattern used for the puncturing of the redundancy symbols W1, and a fifth puncturing pattern used for the puncturing of the redundancy symbols W2. If the elementary codes of the first and second encoders (C1, C2) of the turbo-encoder are identical, the same puncturing pattern can be applied to the redundancy symbols Y1 and the redundancy symbols Y2. In the same way, the same puncturing pattern can be applied to the redundancy symbols W1 and to the redundancy symbols W2.

Other encoding rates can of course be obtained with a turbo-encoder according to the invention, by modifying the number of redundancy outputs.

Figure 5:
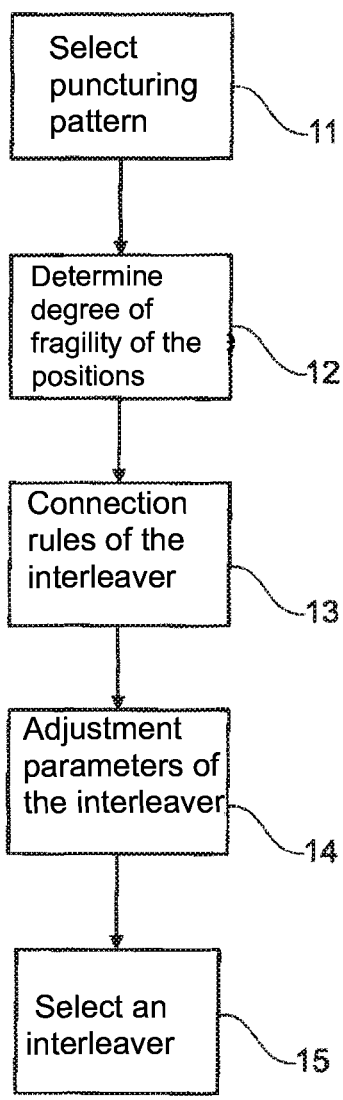
FIG. 5 is a graph illustrating different steps of implementation of a method for building an interleaver.

FIG. 5 represents different steps of implementation of a method for building an interleaver 20 for a turbo-encoder according to FIGS. 1B and 1C. In a step 11, a puncturing pattern is preliminarily selected from among a plurality of puncturing patterns, on the basis of at least a comparison between the distance spectra of the corresponding punctured elementary codes and measurements of mutual information. In a step 12, the degree of fragility of the different positions within the puncturing patterns selected at the step 11 is determined. In a step 13, an interleaving function of the interleaver is established by connecting the positions according to at least one connection rule of said interleaving function, dependent on the degree of fragility of the positions. In a step 14, a restricted set of candidates is determined for the adjustment parameters S(l) of the interleaving function determined in the step 13. During a step 15, at least one interleaver 20 is selected from among the restricted set of candidates of the step 14, on the basis of at least the distance spectra of the turbocodes obtained in using the corresponding interleavers.

A first example of building of an interleaver 20 shall be described with reference to FIGS. 6, 7 and 18 to 22. In this example, the elementary codes of the first and second encoders C1, C2 of the turbo-encoder are the code CSR (13,15)$_8$, the resulting turbocode of which has an encoding rate R=2/3, and the length of the input digital message is equal to K=1504. The puncturing period N, a divider of K, is equal to 16.

The table below lists the best puncturing patterns in terms of distance spectra of the elementary code that have been obtained with N=16. The values $A_d$ represents the multiplicity $A_d$ at the distance d=0, 1, 2, 3, 4. The value '1' corresponds to a non-punctured symbol, the value '0' to a punctured symbol. The case corresponding to $R_{pd}$=4/16 can be represented more simply by means of N=8, giving The pattern corresponding to the ratio $R_{pd}$=10/16 and the higher values are not permissible because they lead to catastrophic puncturing patterns where the rate $R_c$ of the elementary code, depending on the number punctured information symbols, and thus on the ratio $R_{pd}$, is greater than 1.

In a second stage, the mutual information exchanged between the decoders in a uniform interleaving turbo-decoding structure for the permissible puncturing patterns of the above table is measured.

Figure 6:
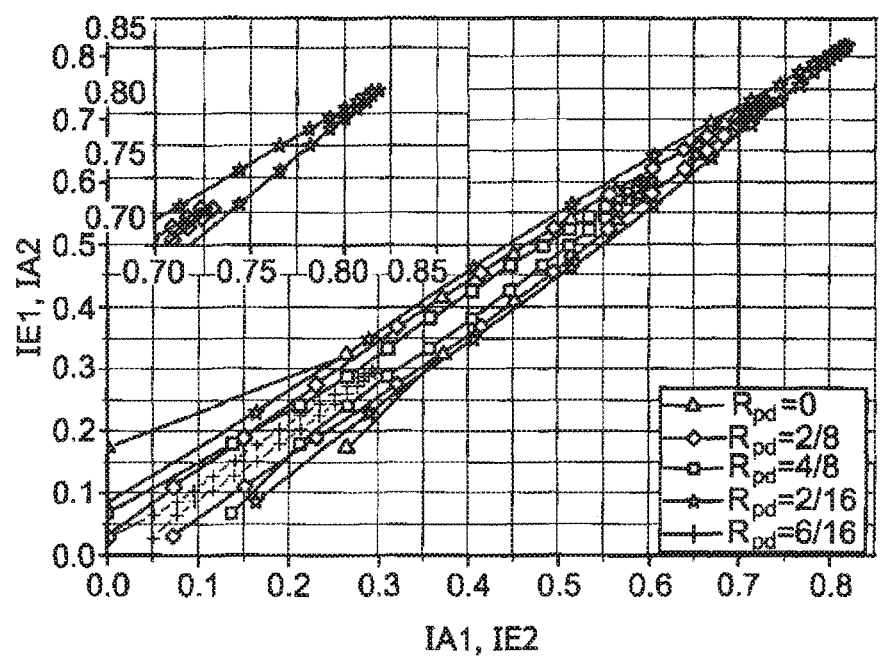
FIG. 6 represents curves for measuring mutual information exchanged between the decoders corresponding to the turbo-encoder according to an exemplary embodiment, used for the selection of the puncturing pattern.

FIG. 6 shows the mean mutual information exchanged between the extrinsic input and output information of each elementary decoder, for $E_b/N_0$=1.6 dB, with 16 turbo-decoding iterations and a Gaussian channel. The quantity of mutual information exchanged is all the greater as the junction point is close to the coordinates point (1,1). In the example considered, the two puncturing patterns corresponding to the ratios $R_{pd}$ of punctured information symbols equal to 2/16 and 2/8 are selected, because the junction points of the curves are closer to the point (1,1) than the junction point of the curves corresponding to $R_{pd}$=0.

Figure 7:
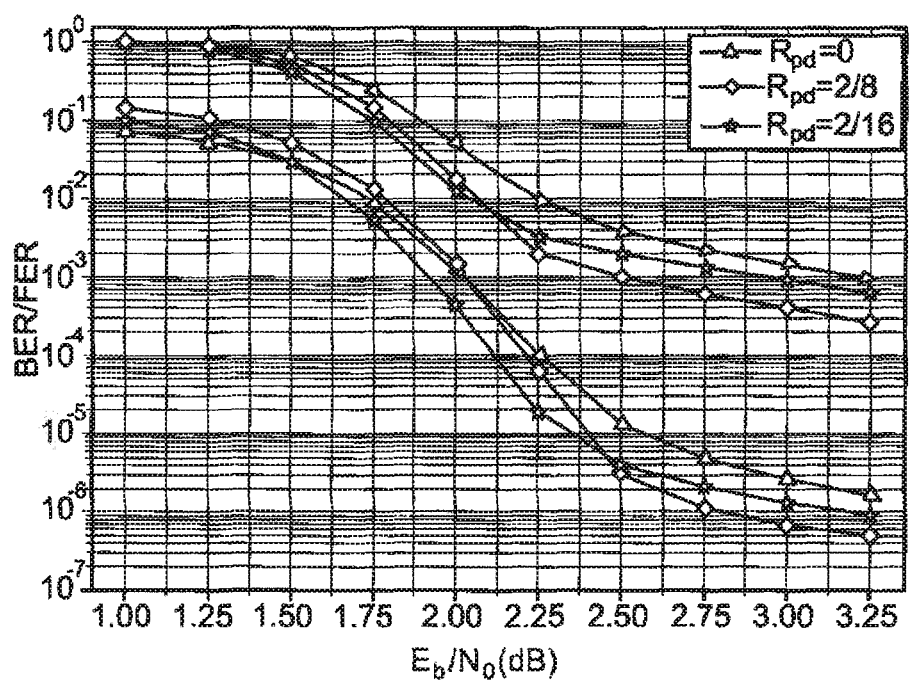
FIG. 7 represents the curves of error rates of the turbo-decoder corresponding to a uniform interleaver for different selected puncturing patterns, FIG. 8, described here above, represents an example of a connection rule of an interleaving function according to the prior art, FIG. 9, described here above, represents a ranking of positions according to their degree of fragility for which the information symbol is not punctured, FIGS. 10A and 10B, described here above, illustrate the determining of the degree of fragility of the positions for which the information symbol is punctured, FIGS. 11 and 12, described here above, illustrate the rules of connection of the interleaving function according to the invention, FIGS. 13A and 13B, described here above, are examples of graphic representations used for the building of the interleaver, FIG. 14, described here above, illustrates the sub-division of the interleaver into Q layers, FIG. 15, described here above, illustrates an example of possible inter-layer adjustment, FIG. 16, described here above, illustrates an example of possible intra-layer adjustment, FIG. 17, described here above, represents the link between the connected positions and the adjustment value $T_l$.
Figure 8:
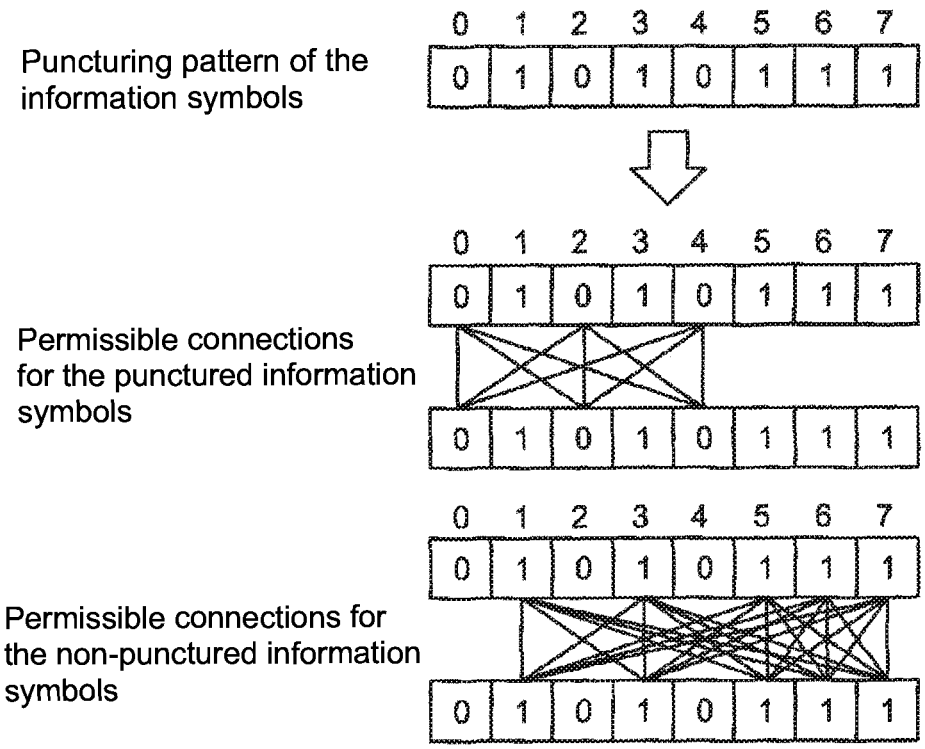
Figure 9:
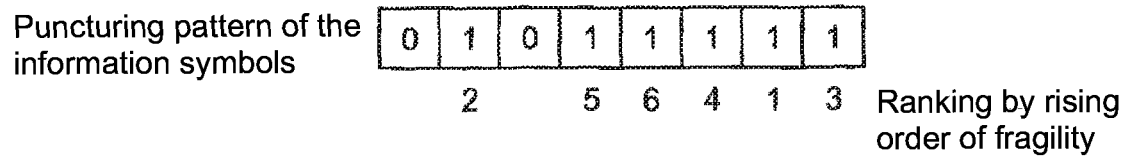
Figure 11:
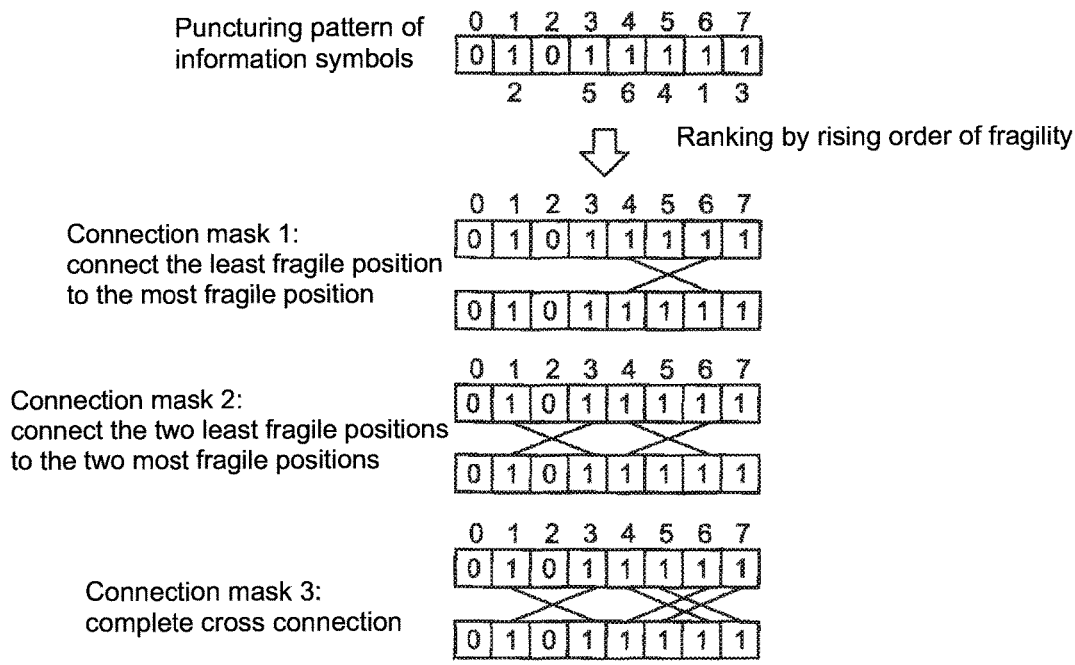
Figure 12:
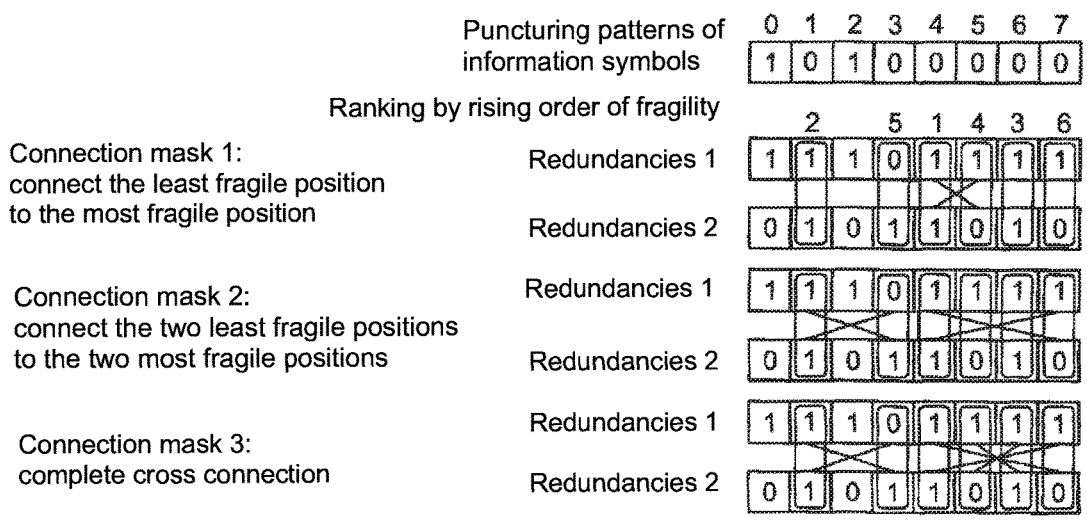
Figure 13A:
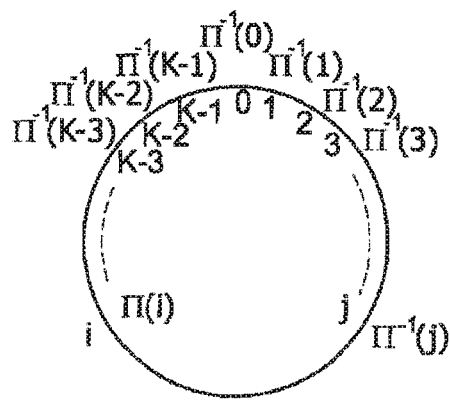
Figure 13B:
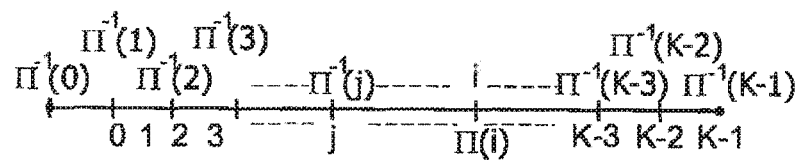
Figure 14:
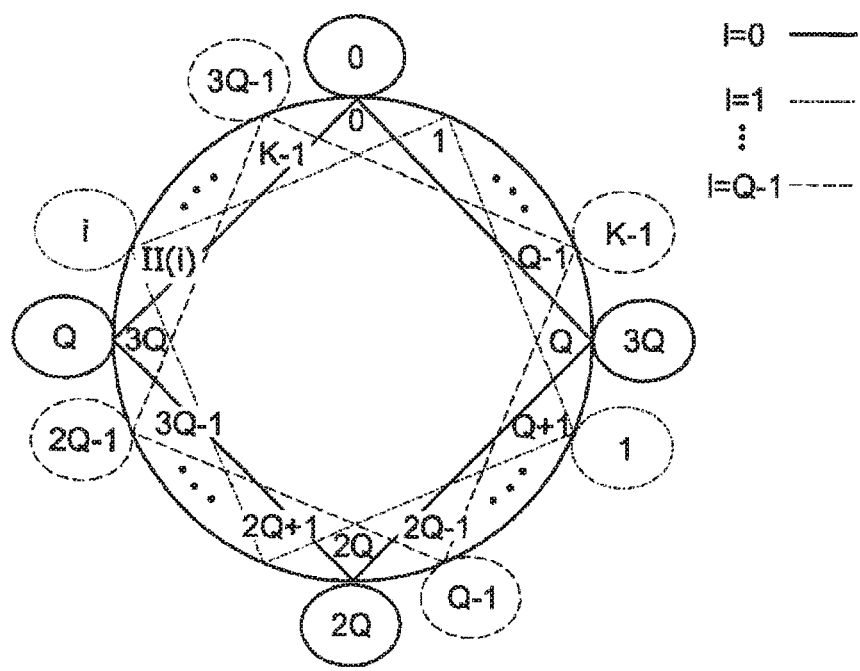
Figure 15:
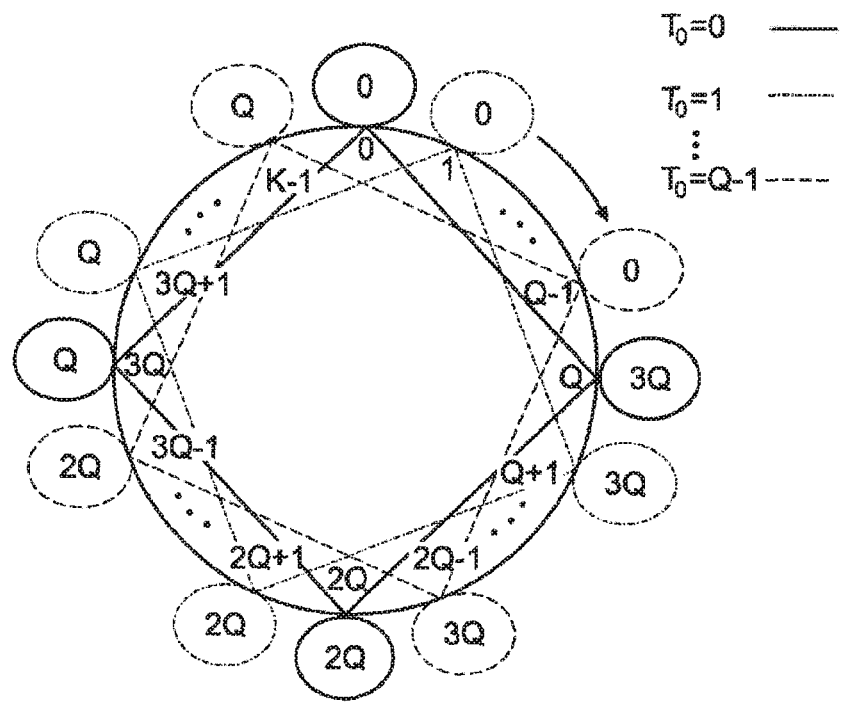
Figure 16:
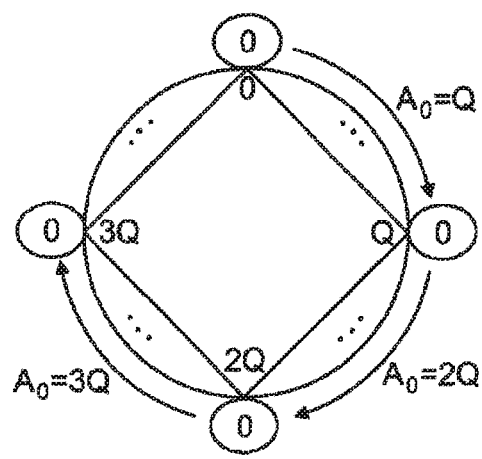
Figure 17:
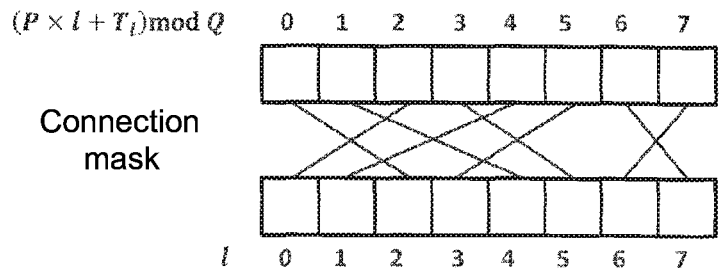

In the example of FIG. 7, the uniform interleaver turbocodes built from the two puncturing patterns selected previously are compared in terms of performance in the waterfall and flare regions, using BPSK (binary phase-shift keying) modulation. If the performance criterion chosen is the error rate with a high signal-to-noise ratio, in the flare region, rather than with a low and average signal-to-noise ratio in the waterfall region, preference is given to the puncturing pattern corresponding to $R_{pd}$=2/8, with resultant information/redundancy symbols=01111110/11000001. If not, the puncturing pattern corresponding to $R_{pd}$=2/16 will be selected.

Figure 18:
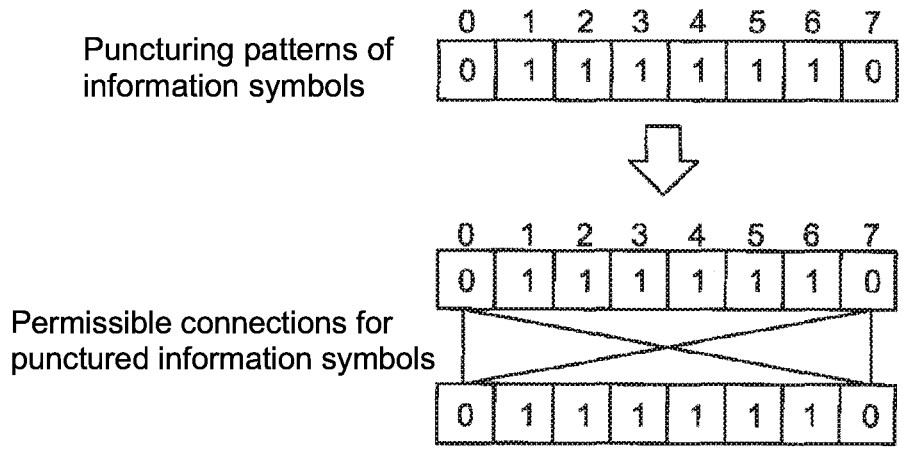
FIG. 18 represents the permissible connections of the interleaver for the punctured information symbols according to the exemplary embodiment of FIGS. 6 and 7, FIGS. 19 and 20 represent examples of connections imposed for the interleaving of the non-punctured information symbols according to the first rule of connection of the interleaving function according to the invention.
Figure 19:
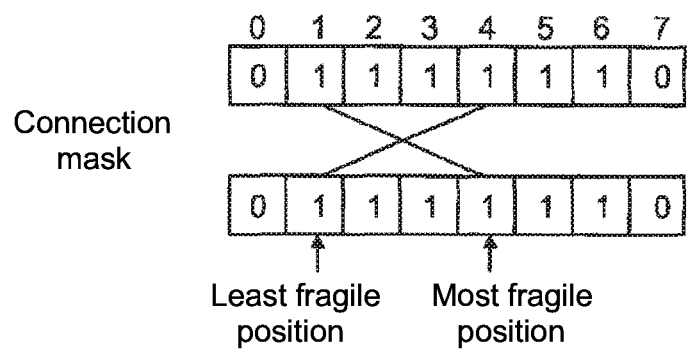
Figure 20:
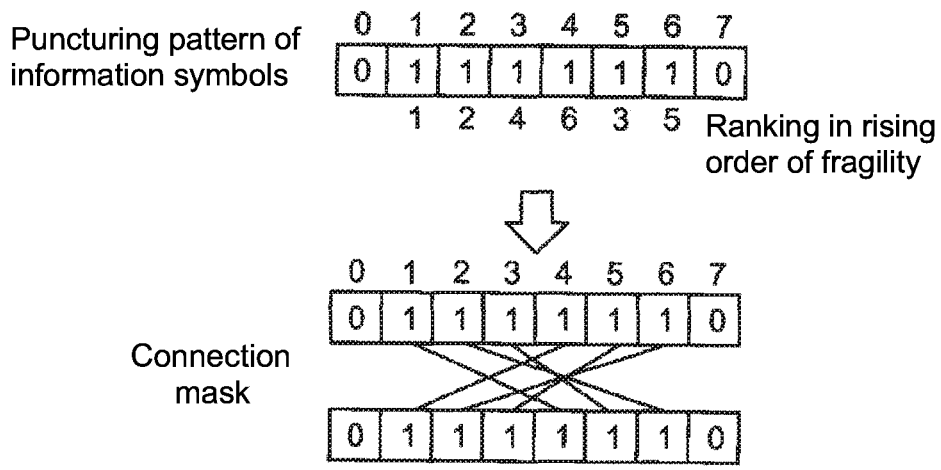

Connection rules of the interlacing function are then chosen as a function of the puncturing pattern. As described here above, according to a known rule, the interleaving function must convert a punctured position for an information symbol in the natural order into a punctured position for the corresponding interleaved information symbol. The permissible connections of the interleaver for the punctured information symbols linked to this rule are illustrated in FIG. 18, for a selected puncturing pattern corresponding to $R_{pd}$=2/8.

As described here above, the positions of the non-punctured information symbols are ranked by degree of fragility, in puncturing each of these symbols one by one, and the distance spectrum of the elementary code resulting in each of the cases is determined. The following table gives the first terms of the associated distant spectra and the ranking of the positions as a function of their degree of fragility, for the puncturing pattern of the redundancies '11000001' corresponding to $R_{pd}=2/8$.

| $A_0$ | $A_1$ | $A_2$ | $A_3$ | $A_4$ | Puncturing pattern considered | Ranking by degree of fragility in rising order |
|---|---|---|---|---|---|---|
| 0 | 0 | 1880 | 1060320 | 465121494 | 00111110 | 1 (least fragile position) |
| 0 | 0 | 4000 | 2003510 | 671273377 | 01011110 | 2 |
| 0 | 4 | 3015 | 1151175 | 294778989 | 01101110 | 4 |
| 0 | 8 | 140 | 2229 | 35176 | 01110110 | 6 (most fragile position) |
| 0 | 2 | 2256 | 1275364 | 320347391 | 01111010 | 3 |
| 0 | 4 | 3019 | 1152688 | 148963135 | 01111100 | 5 |

The first connection rule consisting in connecting the most fragile positions to the least fragile positions, for the non-punctured information symbols, by means of the interleaver can then be applied to all the positions considered or to a part of them only. For example, two cases are considered here. In the first case, the most fragile position is connected to the least fragile position. No additional constraint on the positions of the non-punctured information symbols is dictated for the building of the interleaver. This rule leads to a connection mask for the non-punctured information symbols shown in FIG. 19.

In the second case, a complete cross connection between the positions is made: the most fragile position is connected to the least fragile position, the second most fragile position is connected to the second least fragile position, and so on and so forth. This rule leads to a connection mask for the non-punctured information symbols shown in FIG. 20.

Figure 21:
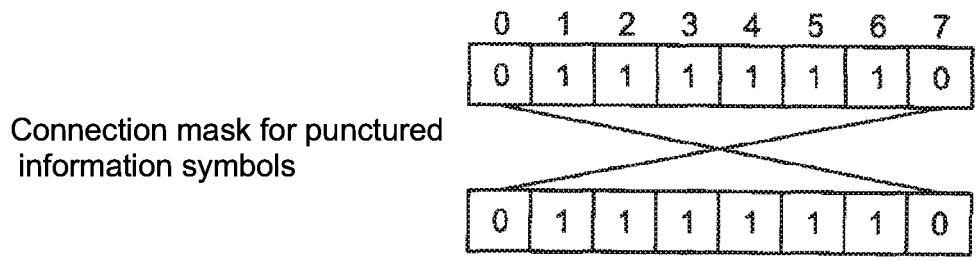
FIG. 21 represents the example of a connection mask for the punctured information symbols as a function of their degree of fragility.

The second connection rule in which the positions of punctured information symbols are connected as a function of their degree of fragility is then applied. In the example considered, there are only two positions for the punctured information symbols, and the connection mask resulting therefrom is shown in FIG. 21.

Figure 22:
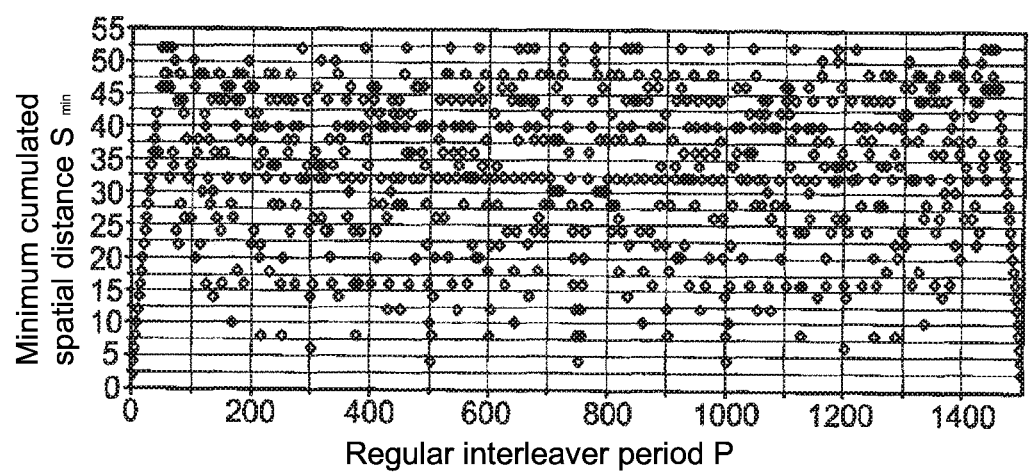
FIG. 22 shows the values of minimum cumulative spatial distance corresponding to the permissible values of the regular interleaver period.

A search is then made for a restricted set of candidates for the adjustment parameters of the previously defined interleaving function. The maximum theoretical value of the minimum spatial cumulated distance of the interleaver for an input message of length K=1504 being equal to 54, the predefined value of the minimum spatial cumulated distance $S_{min}$ can be fixed at 80% of this value, giving 44. The predefined value of the length of the minimum correlation cycle $G_{min}$ is fixed in this example at 8. The permissible values for the interleaving period P are the integer values comprised between 1 and 1503 and co-prime with 1504. FIG. 22 shows the values of the minimum spatial cumulated distance $S_{min}$ corresponding to these permissible values for a regular interleaver, of which the maximum value of the minimum spatial cumulated distance is equal to 52.

To determine the restricted set of candidates for the adjustment parameters S(I) for each value of P chosen, four cases were considered. The first is the reference case where no information symbol is punctured, corresponding to $R_{pd}=0$, called NDP or No Data Punctured. The puncturing pattern of the first row of the first table here above, where only the redundancies are punctured, is used. In this case, no interleaver giving the turbocode a minimum Hamming distance greater than 15 was found.

The second case corresponds to the case where only the interleaver connection rule according to which the interleaving function converts the punctured position of an information symbol in the natural order into a punctured position for the corresponding interleaved information symbol, the case known as DPC (for data puncturing constraint) was taken into account. In this case, seven candidate interleavers at the distance 19 were found.

The third case corresponds to the case where the above-mentioned rule, the first case of the first rule and the second connection rule were taken into account, this case being called DPPC1 (Data and Parity Puncturing Constraint 1). In this case, 14 candidate interleavers at the distance 19 were found.

The fourth case corresponds to the case where the above-mentioned rule, the second case of the first rule and the second connection rule were taken into account. This case is called DPPC2 (Data and Parity Puncturing Constraint 2). In this case, 40 candidate interleavers at the distance 19, and one additional interleaver at the distance 20, were found with search times of the same order of magnitude for the four cases described.

The table below gives the four best interleavers determined for each case as well as the values obtained for the minimum spatial cumulated distance $S_{min}$ and the length of the minimum correlation cycle $G_{min}$.

| Case | $S_{min}$ | $G_{min}$ | P | S(0) | S(1) | S(2) | S(3) | S(4) | S(5) | S(6) | S(7) |
|---|---|---|---|---|---|---|---|---|---|---|---|
| NDP | 45 | 8 | 399 | 0 | 792 | 630 | 829 | 1010 | 90 | 1471 | 658 |
| DPC | 45 | 8 | 227 | 0 | 495 | 998 | 280 | 1090 | 734 | 361 | 362 |
| DPPC1 | 45 | 8 | 699 | 0 | 289 | 1452 | 1292 | 1349 | 391 | 417 | 874 |
| DPPC2 | 45 | 8 | 651 | 0 | 89 | 528 | 852 | 1501 | 1396 | 688 | 490 |

The first three terms of the distance spectrum of the corresponding turbocodes are given in the following table. The value $w_{free}$ corresponds to the cumulated input weight of the code words at the minimum Hamming distance $d_0$.

| Case | $w_{free}$ | $d_0$ | $d_1$ | $d_2$ | $A_{d_0}$ | $A_{d_1}$ | $A_{d_2}$ |
|---|---|---|---|---|---|---|---|
| NDP | 5640 | 15 | 16 | 17 | 1128 | 4512 | 7708 |
| DPC | 4324 | 19 | 20 | 21 | 752 | 1880 | 5264 |
| DPPC1 | 2444 | 19 | 20 | 21 | 376 | 2444 | 3572 |
| DPPC2 | 10716 | 20 | 21 | 22 | 1504 | 3008 | 6016 |

In this example, the puncturing of the information symbols increases the minimum Hamming distance of the turbocode. The application of the first connection rule in partial form and of the second rule, corresponding to the DPPC1 case, does not in this case enable an increase in distance as compared with the known DPC codes, even if the number of code words at the minimum distance $d_0$ is lower. However, the application of the first connection rule in complete form and of the second rule corresponding to the DPPC2 case makes it possible to gain one distance point as compared with the known DPC codes for which the only rule taken into account is the rule according to which the interleaving function converts the punctured position of an information symbol in the natural order into a punctured position for the corresponding interleaved information symbol.

A second example of the building of an interleaver 20 is described with reference to FIGS. 23 to 25. This example differs from the previous example in that the length of the input digital message is equal to K=6144.

Since the distance spectrum of the elementary code does not depend on the value of the length K of the input digital message, the puncturing patterns selected for the previous example are also valid.

Figure 23:
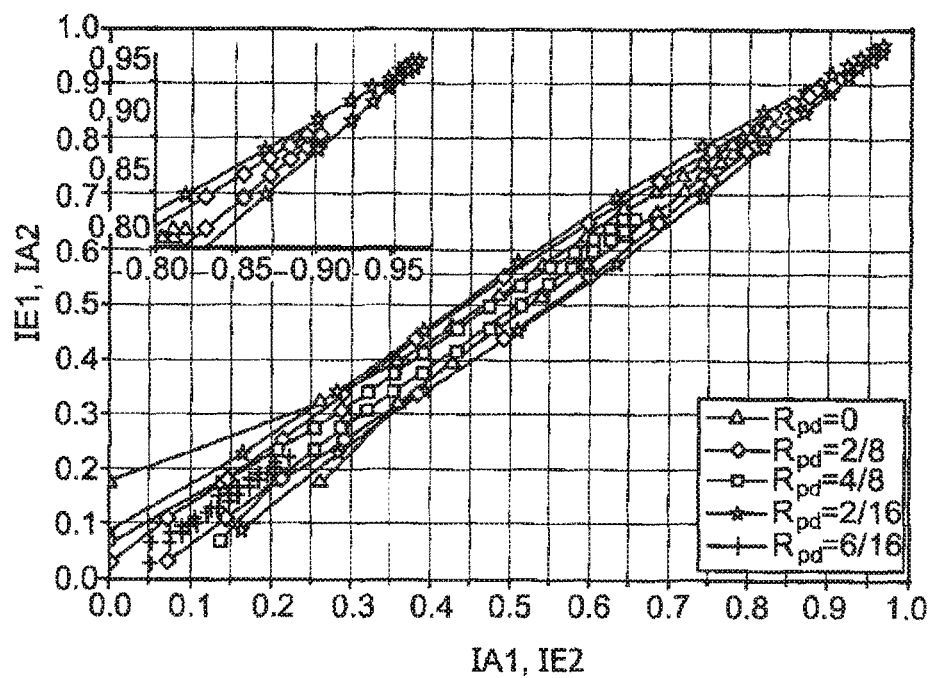
FIG. 23 represents the curves of measurement of mutual information exchanged between the decoders corresponding to the turbo-encoder according to another exemplary embodiment, used for the selection of the puncturing pattern.

FIG. 23 shows the mutual mean information exchanged between the extrinsic input and output information of each elementary decoder. The conclusions are similar to those obtained for K=1504: the patterns selected according to this criterion correspond to the ratios $R_{pd}$ of punctured information symbols equal to 2/16 and 2/8.

Figure 24:
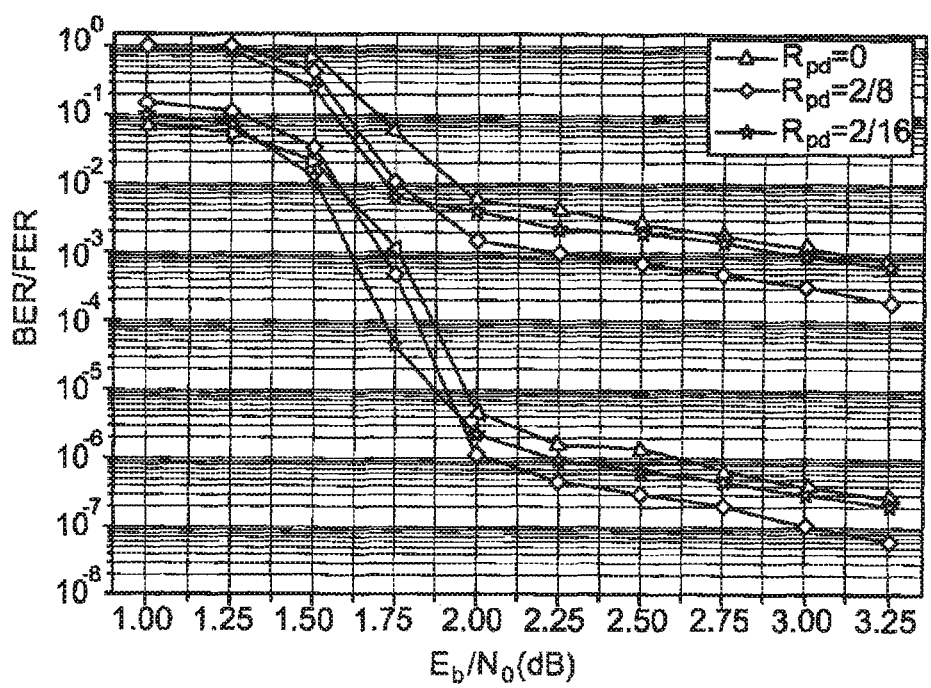
FIG. 24 represents the error rate curves of the turbo-decoder corresponding to a uniform interleaver for different selected puncturing patterns.
Figure 25:
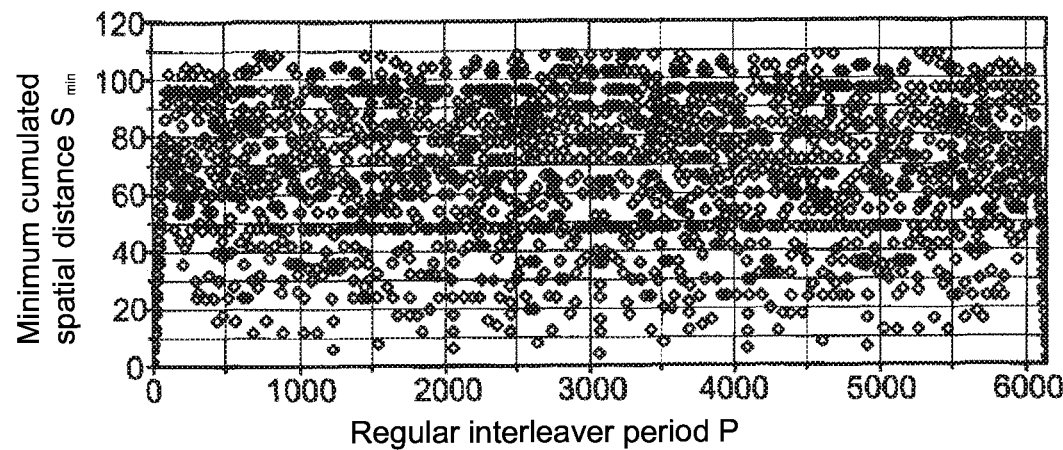
FIG. 25 shows the values of minimum spatial cumulated distance corresponding to permissible values of the regular interleaver period.

FIG. 24 shows the error rate curves of the turbocodes with uniform interleaving built from three puncturing patterns selected at the previous step. The conclusion is also identical with that of the previous example: should low error rates be sought, especially for FER<$10^{-6}$, preference is given to the puncturing pattern corresponding to $R_{pd}$=2/8, the resulting information/redundancy symbols being 01111110/11000001.

Since the selected puncturing pattern is the same as in the previous example, the choice of the connection rules of the interleaving function related to the puncturing can directly re-utilize the previously obtained results.

A search is then made for a restricted set of candidates for the adjustment parameters of the previously defined interleaving function. The maximum theoretical value of the minimum spatial cumulated distance of the interleaver for an input message of length K=6144 being equal to 110, the predefined value of the minimum spatial cumulated distance $S_{min}$ can be fixed at 65% of this value, i.e. 75. The predefined value of the length of the minimum correlation cycle $G_{min}$ is fixed in this example at 8. The permissible values for the interleaver period P are the integer values comprised between 1 and 6143 and co-prime with 6144. FIG. 25 shows the values of the minimum spatial cumulated distance $S_{min}$ corresponding to permissible values for a regular interleaver.

To determine the restricted set of candidates for the adjustment parameters S(1) for each value of P chosen, only the three first cases described here above were considered, namely the cases NDP, DPC and DPPC1.

In the NDP case, no interleaver giving the turbocode a minimum Hamming distance greater than 16 was found. In the DPC case, six candidate interleavers at the distance 22 were found and in the DPPC1 case 78 candidates interleavers at the distance 22 were found for search times of the same order of magnitude.

The following table gives the four best interleavers determined for each case, as well as the values obtained for the minimum spatial cumulated distance $S_{min}$ and the length of the minimum correlation cycle $G_{min}$.

| Case | $S_{min}$ | $G_{min}$ | P | S(0) | S(1) | S(2) | S(3) | S(4) | S(5) | S(6) | S(7) |
|---|---|---|---|---|---|---|---|---|---|---|---|
| NDP | 75 | 9 | 83 | 0 | 3340 | 732 | 2196 | 2877 | 391 | 481 | 4095 |
| DPC | 77 | 8 | 1045 | 0 | 727 | 3195 | 2775 | 4053 | 361 | 4517 | 1652 |
| DPPC1 | 75 | 8 | 3773 | 0 | 4647 | 691 | 511 | 3541 | 6009 | 1773 | 900 |

The first three terms of the distance spectrum of the corresponding turbocodes are given in the following table.

| Case | $w_{free}$ | $d_0$ | $d_1$ | $d_2$ | $A_{d_0}$ | $A_{d_1}$ | $A_{d_2}$ |
|---|---|---|---|---|---|---|---|
| NDP | 30720 | 16 | 17 | 18 | 4608 | 6912 | 16128 |
| DPC | 77568 | 22 | 23 | 24 | 12288 | 7680 | 24756 |
| DPPC1 | 67584 | 22 | 23 | 24 | 10752 | 6144 | 19968 |

In this example too, the puncturing of the information symbols increases the minimum Hamming distance of the turbocode. The application of the first connection rule in partial form and the second rule corresponding to the case DPPC1 does not, in this instance, enable an increase in distance as compared with the known DPC codes, even if the number of code words at the minimum distance $d_0$ is smaller, but it enables the search process to be more efficient and to produce a greater number of the right sets of parameters.

A third example of the building of an interleaver 20 is described with reference to FIGS. 26 to 31. This example differs from the previous example in that the encoding rate is equal to R=4/5 and the length of the input digital message is equal to K=1504.

The table below lists the best puncturing patterns in terms of distance spectrum of the elementary codes that have been obtained for N=16. The case corresponding to $R_{pd}$=0/16 can be more simply represented by means of N=8, i.e. $R_{pd}$=0/8, the resultant information/redundancy symbols being 11111111/01000000. The case $R_{pd}$=4/16 can more simply be represented by means of N=4, giving $R_{pd}$=1/4, the resultant information/redundancy symbols being 1110/1000.

| $R_{pd}$ | $R_c$ | $A_0$ | $A_1$ | $A_2$ | $A_3$ | $A_4$ | Puncturing pattern: information/redundancy symbols |
|---|---|---|---|---|---|---|---|
| 0/16 | 0.88 | 0 | 0 | 4 | 72 | 645 | 1111111111111111/0100000001000000 |
| 2/16 | 0.94 | 0 | 0 | 24 | 525 | 8732 | 0111111111111101/1100000000000010 |
| 4/16 | 1.0 | 0 | 4 | 42 | 424 | 4204 | 1110111011101110/1000100010001000 |
| 6/16 | 1.06 | 1 | 25 | 379 | 5412 | 77412 | 1111001110110001/0001011100100000 |

The patterns corresponding to the ratio $R_{pd}$=6/16 and to the higher values are not permissible because they lead to catastrophic puncturing patterns where the rate $R_c$ of the elementary code is greater than 1.

Figure 26:
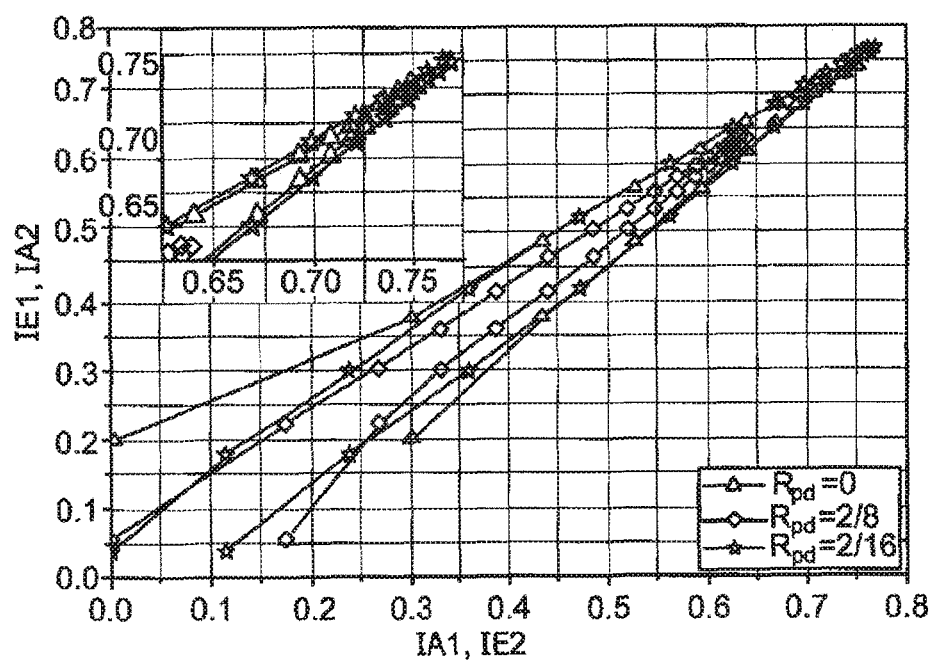
FIG. 26 represents curves of measurement of mutual information exchanged between the decoders corresponding to the turbo-encoder according to another exemplary embodiment, used for the selection of the puncturing pattern.

In a second stage, the mutual information exchanged between the decoders in a turbo-decoding structure with uniform interleaving for the permissible puncturing patterns of the above table is measured. FIG. 26 shows the mean mutual information exchanged between the extrinsic input and output information of each elementary decoder, for $E_b/N_0$=2.55 dB, with 16 turbo-decoding iterations and a Gaussian channel. In the example considered, the only puncturing pattern corresponding to the ratio $R_{pd}$ of the punctured information symbols equal to 2/16 is selected because the junction points of the curves are closer to the point (1,1) than the junction point of the curves corresponding to $R_{pd}$=0.

Figure 27:
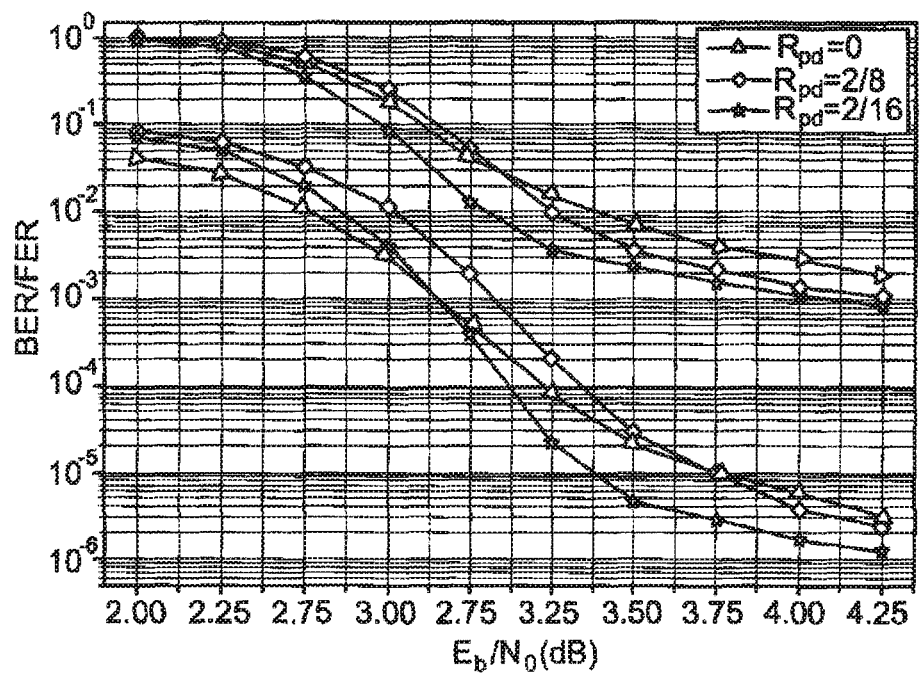
FIG. 27 represents error rate curves of the turbo-decoder corresponding to a uniform interleaver for different selected puncturing patterns.

The uniform interleaver turbocodes built from the puncturing patterns envisaged previously are compared in terms of performance in the waterfall and flare regions, as shown in FIG. 27. These results confirm the choice of the puncturing pattern corresponding to $R_{pd}$=2/16, with resultant information/redundancy symbols=0111111111111101/ 1100000000000010.

Figure 28:
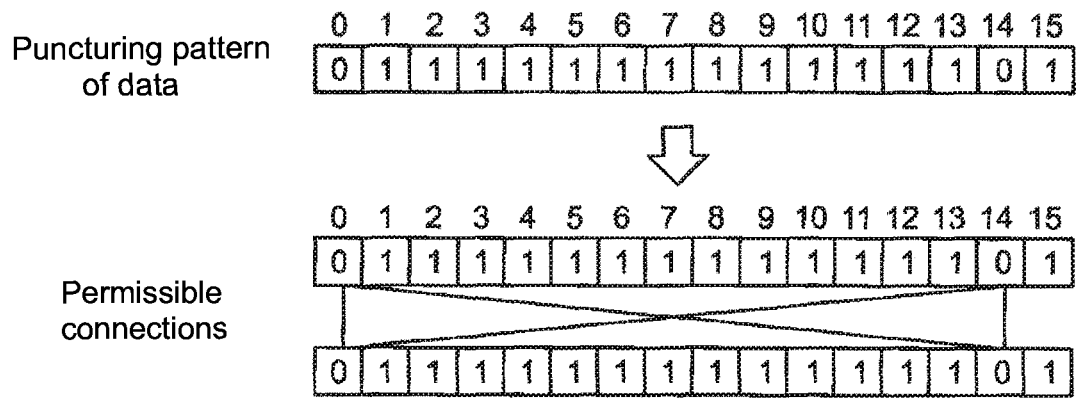
FIG. 28 represents permissible connections of the interleaver for the punctured information symbols according to the exemplary embodiment of FIGS. 26 and 27, FIGS. 29 and 30 represent other examples of connection dictated for the interleaving of the non-punctured information symbols according to the first rule of connection of the interleaving function according to the invention.

For the example considered, the permissible connections of the interleaver for the punctured information symbols linked to the rule according to which the interleaving function must convert a punctured position for an information symbol in the natural order into a punctured position for the corresponding interleaved information symbol are illustrated in FIG. 28.

As described here above, the positions of the non-punctured information symbols are then ranked by degree of fragility, and the distance spectrum of the elementary code resulting in each of the cases is determined. The following table gives the first terms of the associated distance spectra and the ranking of the positions as a function of their degree of fragility for the selected puncturing pattern corresponding to $R_{pd}$=2/16.

same degree of reliability as represented in the "simplified ranking" column of the table here above.

Figure 29:
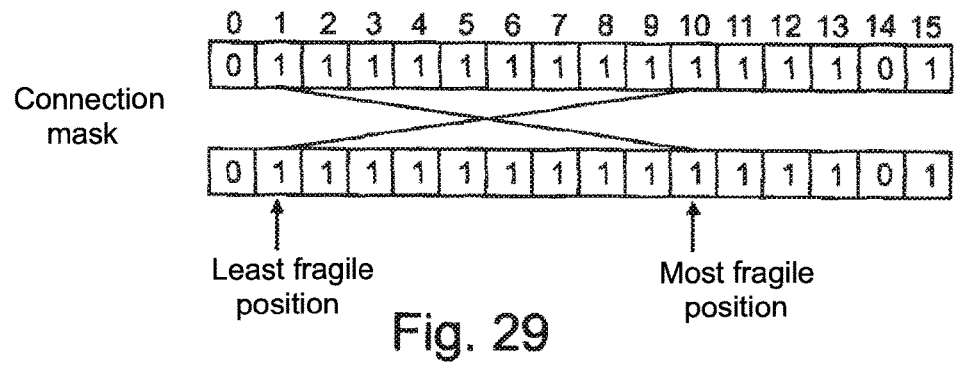

As above, the first case of the first connection rule is applied, the most fragile position being connected to the least fragile position, leading to a connection mask for the non-punctured information symbols represented in FIG. 29.

Figure 30:
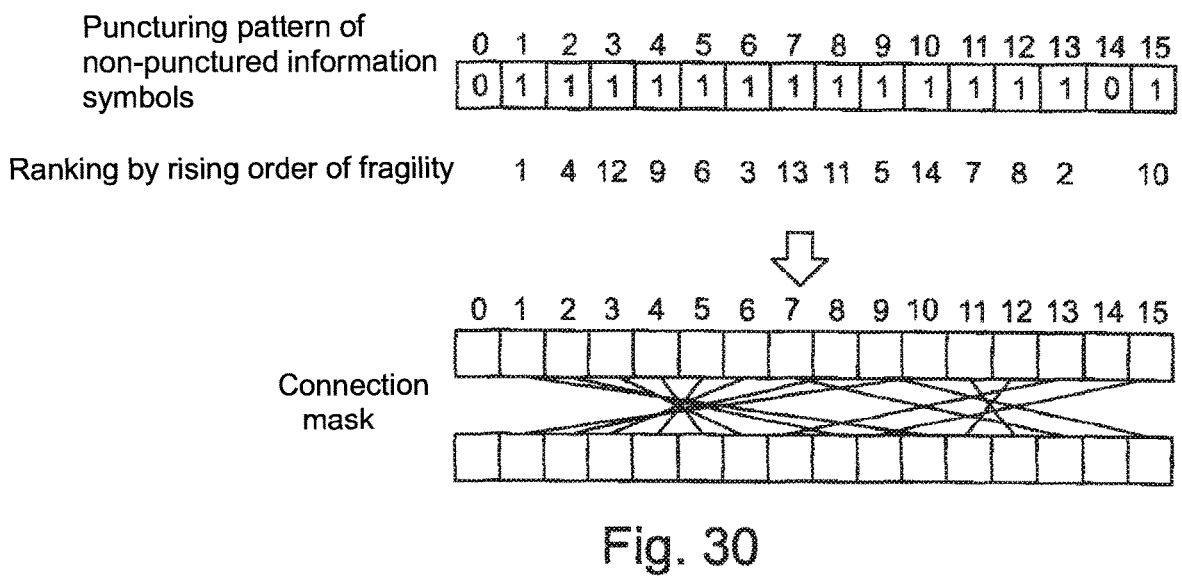

The second case described here above is also applied: a complete cross connection between the positions is performed, leading to a connection mask for the non-punctured information symbols represented in FIG. 30.

Figure 31:
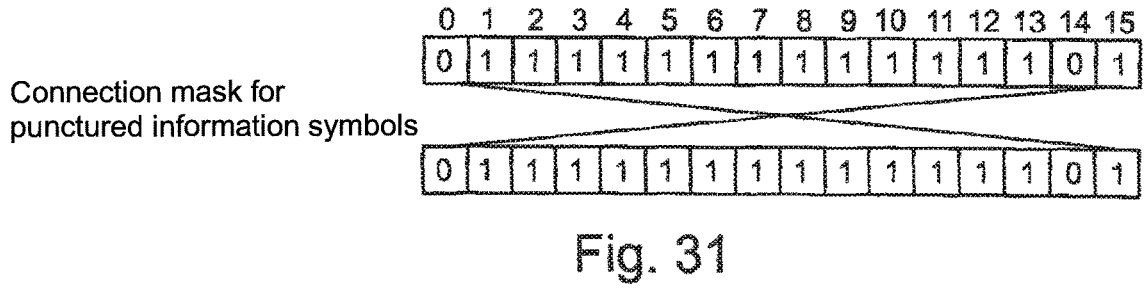
FIG. 31 represents another example of a connection mask for the punctured information symbols as a function of their degree of fragility.

The second connection rule consisting of the connection of the punctured information symbols as a function of their degree of fragility is then applied. In the example considered, there are only two positions for the punctured information symbols, the connection mask resulting therefrom is represented in FIG. 31.

A search is then made for a restricted set of candidates for the adjustment parameters of the previously defined interleaving function. In the example considered, the predefined value of the minimum spatial cumulated distance $S_{min}$ is fixed at 70% of its maximum theoretical value for K=1504, giving 39. The predefined value of the length of the minimum correlation cycle $G_{min}$ is fixed in this example at 8.

To determine the restricted set of candidates for the adjustment parameters S(I) for each value of P chosen, the four cases NDP, DPC, DPPC1 and DPPC2 described here above were considered.

| Order Number of the position | $A_0$ | $A_1$ | $A_2$ | $A_3$ | $A_4$ | Puncturing pattern of selected information symbols | Ranking by degree of fragility in rising order | Simplified ranking |
|---|---|---|---|---|---|---|---|---|
| 1 | 0 | 0 | 3503 | 2200764 | 946127360 | 0011111111111101 | 1 (least fragile position) | 1 |
| 2 | 0 | 2 | 6371 | 3140138 | 1138244658 | 0101111111111101 | 4 | 2 |
| 3 | 0 | 16 | 491 | 13686 | 376258 | 0110111111111101 | 12 | 4 |
| 4 | 0 | 8 | 6047 | 2331934 | 606872251 | 0111011111111101 | 9 | 3 |
| 5 | 0 | 8 | 6032 | 2327999 | 527349550 | 0111101111111101 | 6 | 3 |
| 6 | 0 | 2 | 6125 | 3274279 | 996842927 | 0111110111111101 | 3 | 2 |
| 7 | 0 | 16 | 536 | 16292 | 359330 | 0011111011111101 | 13 | 5 |
| 8 | 0 | 16 | 489 | 13457 | 113075 | 0111111101111101 | 11 | 4 |
| 9 | 0 | 2 | 6376 | 3144441 | 735019476 | 0111111110111101 | 5 | 2 |
| 10 | 0 | 16 | 536 | 16307 | 68224 | 0111111111011101 | 14 (most fragile position) | 5 |
| 11 | 0 | 8 | 6038 | 2332485 | 160321914 | 0111111111101101 | 7 | 3 |
| 12 | 0 | 8 | 6042 | 2328199 | 377642859 | 0111111111110101 | 8 | 3 |
| 13 | 0 | 2 | 6123 | 3272599 | 750308910 | 0111111111111001 | 2 | 2 |
| 15 | 0 | 8 | 6047 | 2334859 | 381315178 | 0111111111111100 | 10 | 3 |

In this example, the position No. 10 is considered to be the most fragile. The position No. 7 presents a similar level of fragility and could also be chosen. Similarly, in this example, several groups of positions have very close degrees of fragility: this is the case for example of the positions No. 2, No. 6, No. 9 and No. 13 on the one hand and No. 4, No. 5, No. 11, No. 12 and No. 14, on the other hand. When the positions No. 2, No. 6, No. 9 or No. 13 are punctured, the first term of multiplicity is identical and equal to 2 while the second terms are close, ranging from 6123 to 6176. Similarly, when the positions No. 4, No. 5, No. 11, No. 12 or No. 14 are punctured, the first multiplicity term is identical and equal to 8, while the second terms are close, ranging from 6032 to 6047. The choice of either of these positions within the same group during the ranking process therefore has only a low impact on the performance of the resultant interleavers. It is thus possible to assign them the In the NDP case, no interleaver conferring a minimum Hamming distance greater than 9 on the turbocode was found. In the DPC case, two candidate interleavers at the distance 11 were found, in the DPPC1 case, six candidate interleavers at the distance 11 were found, and in the DPPC2 case, 23 candidate interleavers at the distance 11 were found.

The table here below gives the four best interleavers determined for each case, as well as the values obtained for the minimum spatial cumulated distance $S_{min}$ and the length of the minimum correlation cycle $G_{min}$.

| Case | $S_{min}$ | $G_{min}$ | P | (S (0) . . . S(15)) |
|---|---|---|---|---|
| NDP | 39 | 8 | 725 | (0, 250, 1224, 239, 931, 48, 236, 449, 30, 856, 1487, 1228, 1440, 1372, 293, 93) |

-continued

| Case | $S_{min}$ | $G_{min}$ | P | (S (0) ... S(15)) |
|---|---|---|---|---|
| DPC | 39 | 8 | 267 | (0, 1436, 521, 1492, 1048, 1142, 1337, 957, 57, 1125, 740, 189, 56, 650, 852, 158) |
| DPPC1 | 39 | 8 | 583 | (0, 1107, 1412, 1038, 909, 1250, 546, 1366, 958, 1445, 299, 178, 1273, 96, 1212, 1487) |
| DPPC2 | 39 | 8 | 365 | (0, 1261, 1374, 1279, 417, 867, 549, 514, 730, 474, 1359, 285, 927, 670, 1176, 1078) |

The first three terms of the distance spectrum of the corresponding turbocodes are given in the following table.

| Case | $w_{free}$ | $d_0$ | $d_1$ | $d_2$ | $A_{d_0}$ | $A_{d_1}$ | $A_{d_2}$ |
|---|---|---|---|---|---|---|---|
| NDP | 12220 | 9 | 10 | 11 | 2350 | 8554 | 29516 |
| DPC | 10434 | 11 | 12 | 13 | 1880 | 5358 | 16732 |
| DPPC1 | 4888 | 11 | 12 | 13 | 940 | 4606 | 12878 |
| DPPC2 | 4324 | 11 | 12 | 13 | 752 | 4794 | 15134 |

A fourth example of the building of an interleaver 20 is described with reference to FIGS. 32 and 33. This example differs from the previous example in that the length of the input digital message is equal to K=6144.

Since the distance spectrum of the elementary code does not depend on the value of the length K of the input digital message, the puncturing patterns selected for the previous example are also valid.

Figure 32:
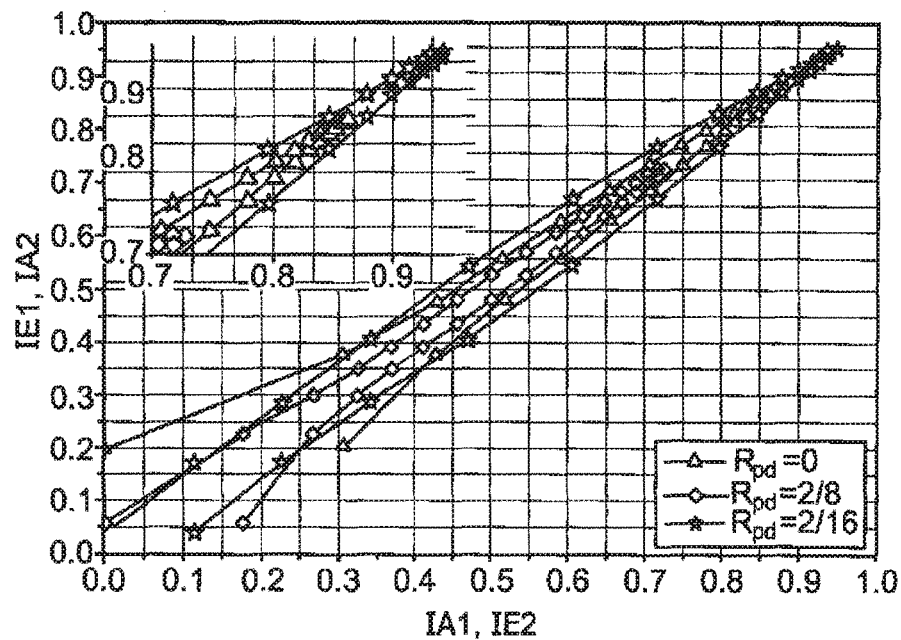
FIG. 32 represents curves of measurement of the mutual information exchanged between the decoders corresponding to the turbo-encoder according to another exemplary embodiment, used for the selection of the puncturing pattern.

FIG. 32 shows the mean mutual information exchanged between the extrinsic input and output information of each elementary decoder. The pattern selected according to this criterion corresponds to the ratio $R_{pd}$ of punctured information symbols equal to 2/16.

Figure 33:
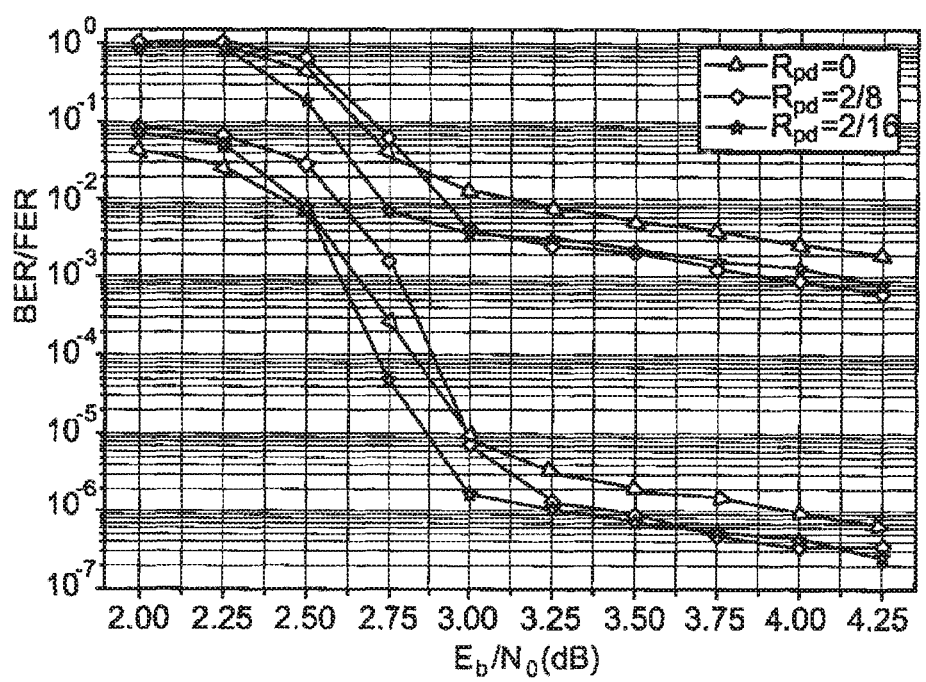
FIG. 33 represents error rate curves of the turbo-decoder corresponding to a uniform interleaver for different puncturing patterns selected according to another exemplary embodiment.

The uniform interleaver turbocodes built from the puncturing patterns envisaged previously are compared in terms of performance in the waterfall and flare regions as shown in FIG. 33. These results confirm the choice of the puncturing pattern corresponding to $R_{pd}$=2/16, with the resultant information/redundancy symbols=0111111111111101/1100000000000010.

Since the selected puncturing pattern is the same as in the previous example, the choice of the connection rules of the interleaving function linked to the puncturing can directly re-utilize the previously obtained results.

A search is then made for a restricted set of candidates for the adjustment parameters of the previously defined interleaving function. In the example considered, the predefined value of the minimum spatial cumulated distance $S_{min}$ is fixed at 70% of its maximum theoretical value for K=6144, i.e. 80. The predefined value of the length of the minimum correlation cycle $G_{min}$ is fixed in this example at 8.

To determine the restricted set of candidates for the adjustment parameters S(l) for each value of P chosen, only the first three cases described here above were considered, namely the cases NDP, DPC and DPPC1.

In the NDP case, no interleaver conferring minimum Hamming distance greater than 10 on the turbocode was found. In the DPC case, 249 candidate interleavers at the distance 12 were found, and in the DPPC1 case 499 candidate interleavers at the distance 12 were found, and eight candidate interleavers at the distance 13.

The table here below gives the four best interleavers determined for each case, as well as the values obtained for the minimum spatial cumulated distance $S_{min}$ and the length of the minimum correlation cycle $G_{min}$.

| Case | $S_{min}$ | $G_{min}$ | P | (S (0) ... S(15)) |
|---|---|---|---|---|
| NDP | 80 | 8 | 4741 | (0, 3987, 2144, 4792, 5501, 3772, 3569, 5513, 1966, 4855, 3369, 3527, 349, 6130, 2295, 807) |
| DPC | 80 | 8 | 3607 | (0, 5579, 1681, 1714, 12, 3337, 140, 586, 1353, 3509, 879, 774, 4117, 850, 876, 5393) |
| DPPC1 | 80 | 8 | 953 | (0, 801, 3826, 5118, 210, 1698, 6065, 684, 5076, 2695, 4119, 5250, 775, 3768, 624, 11) |

The first three terms of the distance spectrum of the corresponding turbocodes are given in the following table.

| Case | $w_{free}$ | $d_0$ | $d_1$ | $d_2$ | $A_{d_0}$ | $A_{d_1}$ | $A_{d_2}$ |
|---|---|---|---|---|---|---|---|
| NDP | 1536 | 10 | 11 | 12 | 384 | 3840 | 25728 |
| DPC | 5376 | 12 | 13 | 14 | 768 | 7680 | 15360 |
| DPPC1 | 14208 | 13 | 14 | 15 | 2304 | 5760 | 28032 |

A fifth example of the building of an interleaver 20 is described with reference to FIGS. 34 to 37. This example differs from the previous examples in that the elementary codes of the first and second encoders C1, C2 of the turbo-encoders are the code CSR $(13,15,17)_8$, the encoding rate being equal to R=1/3 and the length of the input digital message being equal to K=1504.

The table here below lists the best puncturing patterns in terms of distance spectrum of the elementary codes that were obtained for the puncturing period N=8.

| $R_{pd}$ | $R_c$ | $A_4$ | $A_5$ | $A_6$ | $A_7$ | $A_8$ | $A_9$ | $A_{10}$ | Puncturing pattern: information/redundancy 1/redundancy 2 symbols |
|---|---|---|---|---|---|---|---|---|---|
| 0/8 | 0.5 | 0 | 0 | 2 | 0 | 10 | 0 | 49 | 11111111/11111111/00000000 |
| 2/8 | 0.53 | 0 | 3 | 20 | 33 | 83 | 202 | 311 | 11101110/10110000/01011111 |
| 4/8 | 0.57 | 0 | 6 | 12 | 35 | 90 | 223 | 479 | 10101010/11111111/01000100 |
| 6/8 | 0.62 | 2 | 26 | 66 | 165 | 500 | 1526 | 2845 | 10100000/11101111/01011010 |
| 8/8 | 0.66 | 3 | 11 | 35 | 114 | 378 | 1253 | 4147 | 00000000/11111111/10101010 |

All the values of the ratio $R_{pd}$ are permissible because they lead to rate values $R_c$ of the elementary code lower than 1.

Figure 34:
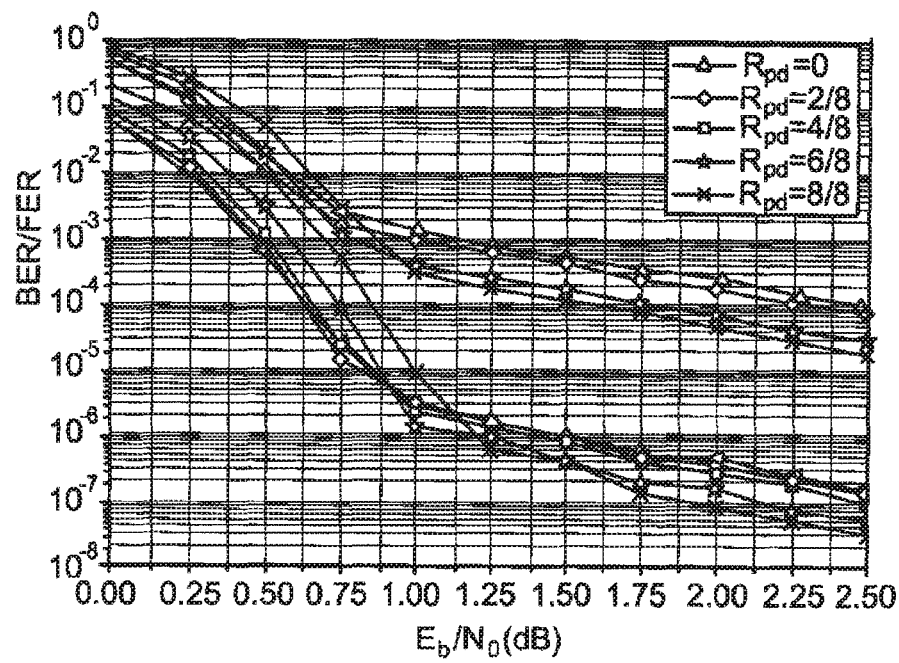
FIG. 34 represents error rate curves of the turbo-decoder corresponding to a uniform interleaver for different puncturing patterns selected.

Performance of the uniform interleaver turbocodes built from the puncturing patterns of the table here above are compared in the waterfall and flare regions as represented in FIG. 34. The puncturing pattern corresponding to $R_{pd}$=6/8 with resultant information/redundancy symbols=10100000/11101111/01011010 is chosen.

Figure 35:
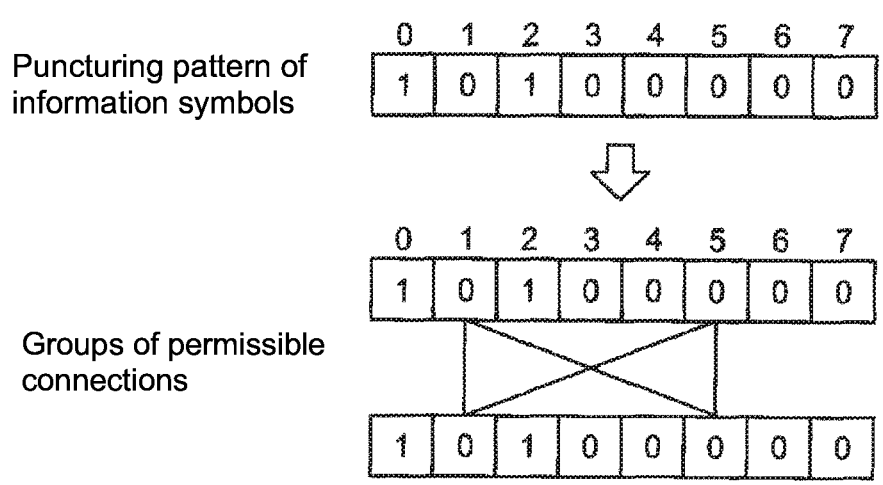
FIG. 35 represents permissible conditions of the interleaver for punctured information symbols according to the exemplary embodiment of FIG. 34.

For the example considered, the permissible connections of the interleaver for the punctured information symbols linked to the rule according to which the interleaving function must convert a punctured position for an information symbol in the natural order into a punctured position for the corresponding interleaved information symbol are illustrated in FIG. 35.

Figure 36:
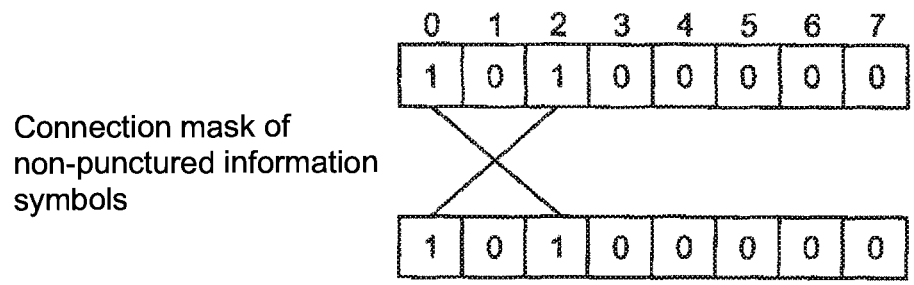
FIG. 36 represents another example of connections dictated for the interleaving of non-punctured information symbols according to the first rule of connections of the interleaving function according to the invention, according to the exemplary embodiment of FIG. 34.

As described here above, the first connection rule in which positions of non-punctured information symbols are connected as a function of their degree of fragility is then applied. In the example considered, there are only two positions for the non-punctured information symbols, the connection mask resulting therefrom is shown in FIG. 36.

Figure 37:
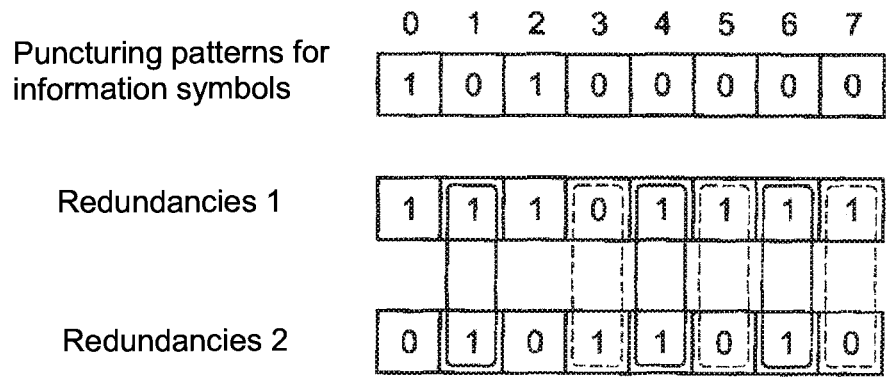
FIG. 37 represents another example of a connection mask for the punctured information symbols as a function of their degree of fragility according to the exemplary embodiment of FIG. 34.

The second connection rule consisting in connecting positions of punctured information symbols as a function of their degree of fragility is then applied. In the example considered, FIG. 37 illustrates the determining of two degrees of fragility of the positions as a function of the number of punctured redundancy symbols: the positions identified by dashes, corresponding to a punctured redundancy symbol, are more fragile than the positions identified in unbroken lines, corresponding to no punctured redundancy symbols. According to this rule, each of these positions No. 1, 4 and 6 are connected to one of the positions Nos. 3, 5 and 7.

As search is then made for a restricted set of candidates for the adjustment parameters of the previously defined interleaving function. In the example considered, the predefined value of the minimum spatial cumulated distance $S_{min}$ is fixed at 80% of its maximum theoretical value for K=1504, giving 44. The predefined value of the length of the minimum correlation cycle $G_{min}$ is fixed in this example at 8.

To determine the restricted set of candidates for the adjustment parameters S(l) for each value of P chosen, the three cases NDP, DPC and DPPC1 described here above were considered. The DPPC1 case corresponds to the case where the first connection rule and the second connection rule as described here above have been applied.

In the NDP case, no interleaver conferring a minimum Hamming distance greater than 49 on the turbocode was found. In the DPC case, two candidate interleavers at the distance 59 were found, and in the DPPC1 case one candidate interleaver at the distance 61 was found.

The table here below gives the best interleavers determined for each case, as well as the values obtained for the minimum spatial cumulated distance $S_{min}$ and the length of the minimum correlation cycle $G_{min}$.

| Case | $S_{min}$ | $G_{min}$ | P | S(0) | S(1) | S(2) | S(3) | S(4) | S(5) | S(6) | S(7) |
|---|---|---|---|---|---|---|---|---|---|---|---|
| NDP | 47 | 8 | 59 | 0 | 619 | 1198 | 1496 | 1209 | 1260 | 917 | 973 |
| DPC | 45 | 8 | 1219 | 0 | 938 | 732 | 1427 | 739 | 378 | 449 | 1297 |
| DPPC1 | 45 | 8 | 487 | 2 | 462 | 106 | 191 | 131 | 342 | 601 | 1197 |

The first three terms of the distance spectrum of the corresponding turbocodes are given in the table here below.

| Case | $w_{free}$ | $d_0$ | $d_1$ | $d_2$ | $A_{d_0}$ | $A_{d_1}$ | $A_{d_2}$ |
|---|---|---|---|---|---|---|---|
| NDP | 2632 | 49 | 50 | 51 | 376 | 564 | 940 |
| DPC | 752 | 59 | 60 | 61 | 188 | 376 | 376 |
| DPPC1 | 3196 | 61 | 62 | 63 | 376 | 376 | 564 |

An interleaver thus built can then be used in a turbo-encoder according to the invention. In particular, as already indicated, an interleaver of this kind distributes the information symbols of the input message in Q layers of the interleaved input message in complying with the interleaving function defined from the puncturing pattern or patterns according to the relationship:

$\pi(i)=Pi+S(i \bmod Q)\bmod K=Pi+S(l)\bmod K=Pi+(T_l+A_lQ)\bmod K$

FIGS. 38 to 41 show the performance in terms of binary error rate or bit error rate BER and the frame error rate FER of the punctured turbocodes using the different interleaving configurations proposed. Significant gains are obtained relative to the LTE turbocode which uses a QPP interleaving and the puncturing technique known as "rate matching".

Figure 38:
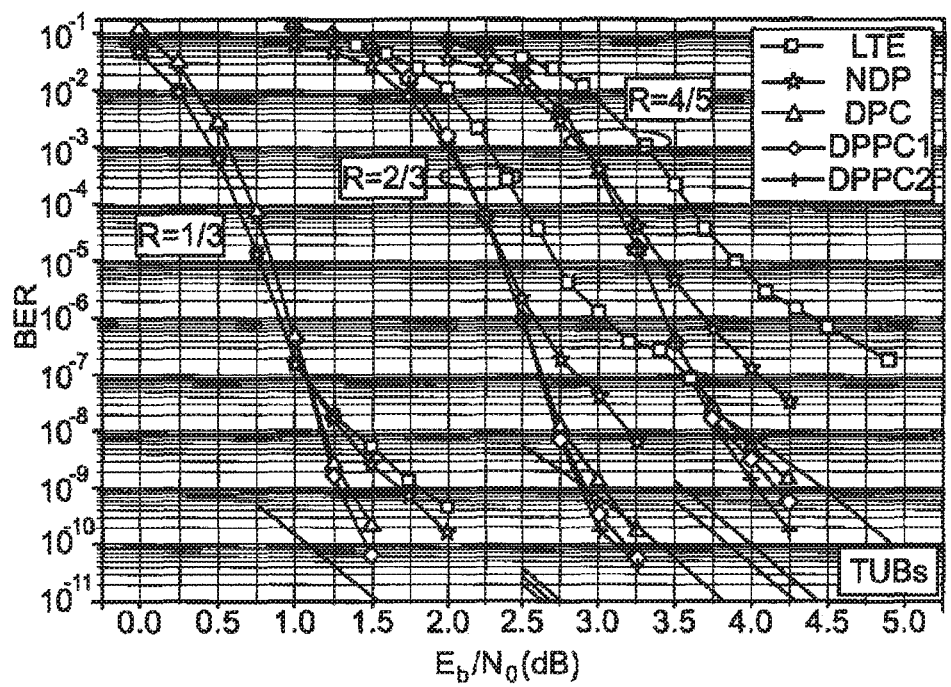
FIG. 38 represents bit error rate curves on a Gaussian channel of the turbocode for different configurations of interleaving, for an input digital message length K=1504.

FIG. 38 represents the bit error rate curves of the turbo-code for different interleaving configurations for different encoding rates R, with a Gaussian channel, a BPSK modulation, a length of the input digital message equal to K=1504, and 16 decoding iterations using the BCJR (Bahl-Cocke-Jelinek-Raviv) algorithm. The TUB indication designates the truncated union bound corresponding to the first terms of the union bound applied to the error probability per pair. The union bound also called Boole's inequality defines the probability of occurrence of any unspecified event taken in a set of discrete events, and is smaller than or equal to the sum of the probabilities of each of the events taken separately. The probability of error per pair P(x,x') corresponds to the probability that the decoder will decode the code word x' while the code word x has been transmitted. The union bound makes it possible to obtain the lower bound for the probability that the decoder will make a mistake when the code word x has been transmitted: Pe $(x) \leq \Sigma x'$ P(x, x'). To obtain the TUB, we consider only the terms of the sum corresponding to the code words x' closest to x instead of all the code words x' possible.

Figure 39:
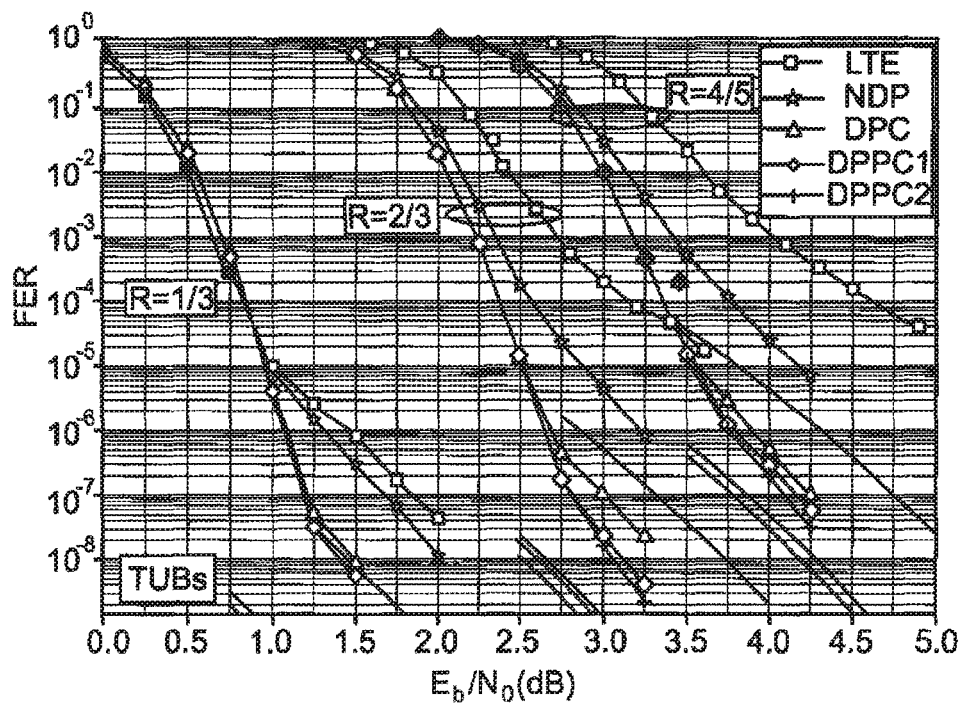
FIG. 39 represents frame error rate curves on a Gaussian channel of the turbocode for different interleaving configurations, for an input digital message length K=1504.

FIG. 39 represents the frame error rate curves on the Gaussian channel of the turbocode for different interleaving configurations for different encoding rates R, with a Gaussian channel, a BPSK modulation, an input digital message length equal to K=1504 and 16 BCJR decoding iterations.

Figure 40:
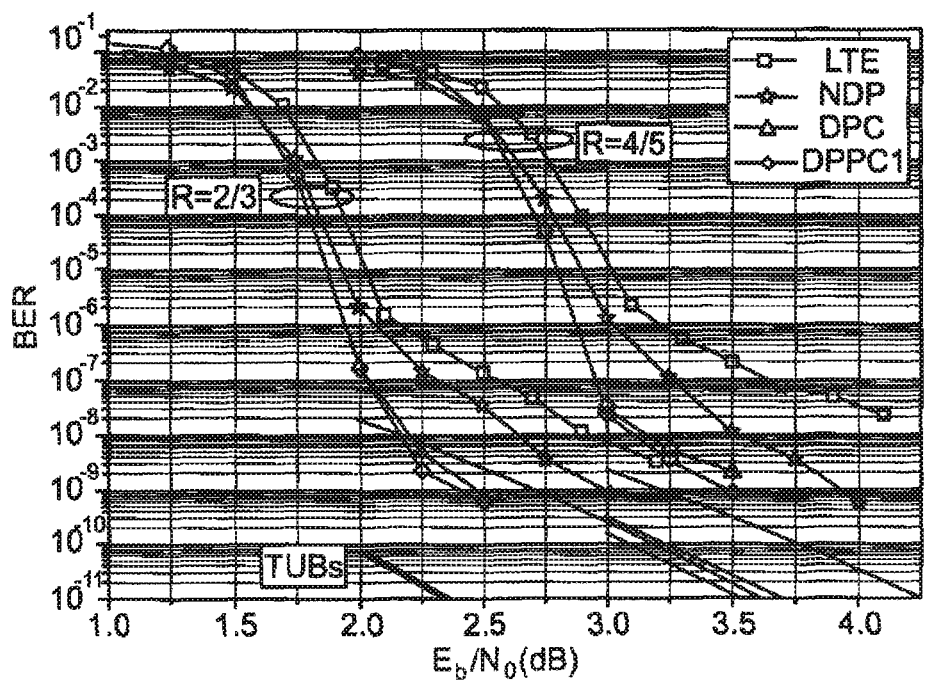
FIG. 40 represents bit error rate curves on a Gaussian channel of the turbocode for different interleaving configurations, for a length of the input digital message K=6144.

FIG. 40 represents the bit error rate curves of the turbo-code for different interleaving configurations, for different encoding rates R, with a Gaussian channel, a BPSK modulation, an input digital message length equal to K=6144 and 16 BCJR decoding iterations.

Figure 41:
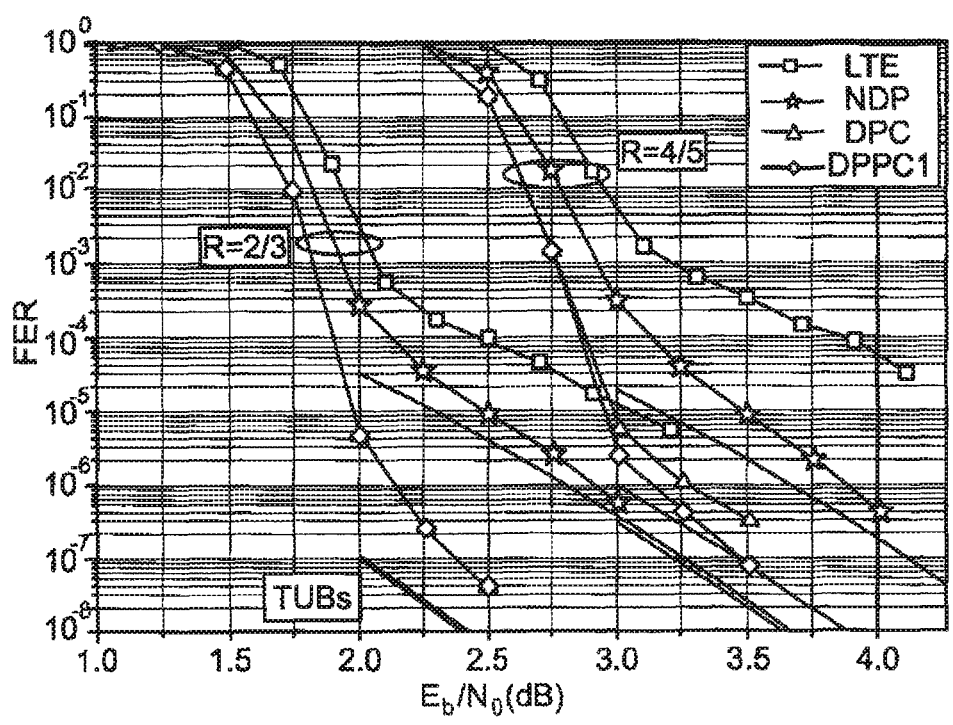
FIG. 41 represents frame error rate curves on a Gaussian channel of the turbocode for different interleaving configurations, for a length of an input digital message K=6144.

FIG. 41 represents the frame error rate curves on a Gaussian channel of the turbocode for different interleaving configurations, for different encoding rates R, with a Gaussian channel, a BPSK modulation, an input digital message length equal to K=6144 and 16 BCJR decoding iterations.

The invention is not limited to the examples that have just been described.

Possible applications of the invention include transmission systems under the future fifth-generation or 5G mobile telephony standard. These systems will in fact have to respond to new cases of use requiring very reliable connections and/or very efficient connections from the viewpoint of spectral use. The corresponding transmission modes should also make use of error correction codes that have better performance at low error rates than the current codes under the 3G and 4G standards.

The invention can be used in applications for which security is of prime importance in the context of what is known as "mission critical communications", applications such as those related to the coordination of vehicles, control of electrical networks, or broadcasting applications where the return channel cannot be used for the retransmission of data, or in all applications requiring low latency and for which the use of the return channel must be avoided as much as possible, for example in interactive online gaming applications.

The expression "comprising one" must be understood to mean "comprising at least one" unless otherwise specified.

Although the present disclosure has been described with reference to one or more examples, workers skilled in the art will recognize that changes may be made in form and detail without departing from the scope of the disclosure and/or the appended claims.

The invention claimed is:

1. A method comprising:
encoding an input digital message bearing K information symbols using a turbo-encoder forming a turbocode, the turbo-encoder comprising an interleaver and first and second encoders for encoding according to at least one elementary code and delivering said information symbols and redundancy symbols,
wherein, with a puncturing of the symbols delivered by the turbo-encoder being done according to at least one periodic puncturing pattern of a length N, defining the puncturing period, said interleaver distributes the information symbols of said input message into Q layers of the interleaved input message in complying with an interleaving function defined from said at least one puncturing pattern, according to the relationship:

$$\pi(i)=Pi+S(i \bmod Q) \bmod K = Pi+(T_l+A_l Q) \bmod K$$

with:
i=0, ..., K−1 being the position of an information symbol in said interleaved input message, in the interleaved order and π(i) the position of said information symbol in said input message, in the natural order;
P an integer value co-prime with the length K of said input message, called an interleaver period;
S(i mod Q)=S(l)=$T_l$+$A_l$Q are the parameters of adjustment of the interleaving function, with l=0, ..., Q−1 the layer number;
Q a degree of disorder inserted into the interleaver, corresponding to the number of layers, such that Q=qN, with q≥1 being an integer and Q being a divisor of K;
$T_l$ a value of inter-layer adjustment defined from said at least one puncturing pattern; and
$A_l$ a value of intra-layer adjustment.

2. The method according to claim 1, wherein, said puncturing implementing a puncturing of the information symbols delivered by said turbo-encoder, the value of inter-layer adjustment $T_l$ makes the punctured information symbols correspond with one another between their position in the natural order and their position in the interleaved order.

3. The method according to claim 1, wherein the inter-layer adjustment values $T_l$ makes the positions of the most fragile non-punctured information symbols correspond with the positions of the least fragile non-punctured information symbols,
the degree of fragility of the positions being determined by comparing the distance spectra of the elementary codes obtained in puncturing each of the non-punctured information symbols one by one, the least fragile position corresponding to the spectrum having the greatest minimum Hamming distance and the lowest multiplicity and the most fragile position corresponding to the spectrum having the smallest minimum Hamming distance and the greatest multiplicity, the multiplicity corresponding to the number of words of an elementary code at a distanced.

4. The method according to claim 3, wherein the degrees of fragility of the positions having the same number of punctured redundancy symbols are determined on the basis of at least one comparison of the distance spectra of the elementary codes obtained by puncturing non-punctured redundancy symbols one by one, the least fragile position corresponding to the spectrum having the greatest minimum Hamming distance and the lowest multiplicity, and the most fragile position corresponding to the spectrum having the lowest minimum Hamming distance and the greatest multiplicity.

5. The method according to claim 1, wherein the inter-layer adjustment values $T_l$ makes the positions of the most fragile punctured information symbols correspond with the positions of the least fragile punctured information symbols,
the degree of fragility of the positions being determined as a function of the number of punctured redundancy symbols, the least fragile positions being those for which no redundancy symbol is punctured and the most fragile positions being those for which all the redundancy symbols are punctured.

6. The method according to claim 5, wherein the degrees of fragility of the positions having the same number of punctured redundancy symbols are determined on the basis of at least one comparison of the distance spectra of the elementary codes obtained by puncturing non-punctured redundancy symbols one by one, the least fragile position corresponding to the spectrum having the greatest minimum Hamming distance and the lowest multiplicity, and the most fragile position corresponding to the spectrum having the lowest minimum Hamming distance and the greatest multiplicity.

7. The method according to claim 1, wherein the adjustment parameters of the interleaving function are determined as a function of predefined values of the minimum cumulative spatial distance $S_{min}$ and of the length of the minimum correlation cycle $G_{min}$ of the interleaver for at least one interleaver period P,
the length of the minimum correlation cycle $G_{min}$ of the interleaver corresponding to the length of the shortest correlation cycle of the graph of correlation between the input message, in the natural order, and the interleaved input message in the interleaved order.

8. The method according to claim 7, wherein the predefined value of the minimum cumulative spatial distance $S_{min}$ of the interleaver is smaller than or equal to the greatest integer smaller than the square root of twice the length K of the input digital message $S_{min}=\lfloor\sqrt{2K}\rfloor$, and the predefined value of the length of the minimum correlation cycle $G_{min}$ of the interleaver is smaller than or equal to Moore's theoretical limit $\in 2 \log_3(K)\rfloor$.

9. The method according to claim 1, wherein the period P of the interleaver is chosen to ensure a minimum cumulative spatial distance value $S_{min}$ of the interleaver greater than or equal to the minimum cumulative spatial distance of a regular interleaver whose interleaving function is Π(i)=Pi mod K.

10. The method according to claim 1, wherein the two elementary codes of the first and second encoders of the turbo-encoder are identical.

11. The method according to claim 1, wherein the elementary codes of the first and second encoders of the turbo-encoder are circular.

12. The method according to claim 1 wherein the puncturing period is a divider of the length of the input digital message.

13. A non-transitory computer-readable medium comprising a computer program stored thereon and comprising instructions for implementing a method of encoding when this the instructions are executed by a processor of a turbo-encoder, the method comprising:
- encoding an input digital message bearing K information symbols using the turbo-encoder, the turbo-encoder forming a turbocode and comprising an interleaver and first and second encoders for encoding according to at least one elementary code and delivering said information symbols and redundancy symbols,
- wherein, with a puncturing of the symbols delivered by the turbo-encoder being done according to at least one periodic puncturing pattern of a length N, defining the puncturing period, said interleaver distributes the information symbols of said input message into Q layers of the interleaved input message in complying with an interleaving function defined from said at least one puncturing pattern, according to the relationship:

$$\pi(i)=Pi+S(i \bmod Q) \bmod K=Pi+(T_l+A_lQ)\bmod K$$

with:
- i=0, ..., K−1 being the position of an information symbol in said interleaved input message, in the interleaved order and $\pi(i)$ the position of said information symbol in said input message, in the natural order;
- P an integer value co-prime with the length K of said input message, called an interleaver period;
- $S(i \bmod Q)=S(l)=T_l+A_lQ$ are the parameters of adjustment of the interleaving function, with l=0, ..., Q−1 the layer number;
- Q a degree of disorder inserted into the interleaver, corresponding to the number of layers, such that Q=qN, with q≥1 being an integer and Q being a divider of K;
- $T_l$ a value of inter-layer adjustment defined from said at least one puncturing pattern; and $A_l$ a value of intra-layer adjustment.

14. A turbo-encoder device comprising:
a processor; and
a non-transitory computer-readable medium comprising instructions stored thereon, which when executed by the processor configure the turbo-encoder device to:
- encode an input digital message bearing K information symbols using an interleaver and first and second encoders for encoding according to at least one elementary code, and delivering said information symbols and redundancy symbols,
- wherein a puncturing of the symbols delivered by said turbo-encoder being done according to at least one periodic puncturing pattern of a length N, defining the puncturing period, said interleaver distributes the information symbols of said input message in Q layers of the interleaved input message in complying with an interleaving function defined from said at least one puncturing pattern, according to the relationship:

$$\pi(i)=Pi+S(i \bmod Q) \bmod K=Pi+S(l) \bmod K=Pi+(T_l+A_lQ)\bmod K$$

with:
- i=0, ..., K−1 being the position of an information symbol in said interleaved input message, in the interleaved order and $\pi(i)$ the position of said information symbol in said input message, in the natural order;
- P an integer value co-prime with the length K of said input message, called an interleaver period;
- $S(i \bmod Q)=S(l)=T_l+A_lQ$ the parameters of adjustment of the interleaving function, with l=0, ..., Q−1 the layer number;
- Q a degree of disorder inserted into the interleaver, corresponding to the number of layers, such that Q=qN, with q≥1 being an integer and Q being a divider of K;
- $T_l$ is a value of inter-layer adjustment defined from said at least one puncturing pattern; and
- $A_l$ a value of intra-layer adjustment.

* * * * *

UNITED STATES PATENT AND TRADEMARK OFFICE
CERTIFICATE OF CORRECTION

PATENT NO.         : 10,560,124 B2                           Page 1 of 1
APPLICATION NO.    : 15/738004
DATED              : February 11, 2020
INVENTOR(S)        : Ronald Edicson Garzon Bohorquez et al.

It is certified that error appears in the above-identified patent and that said Letters Patent is hereby corrected as shown below:

In the Claims

In Claim 3, Column 32, Line 2:
Please delete "distanced" and insert --distance d--.

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*